United States Patent
Heyderman et al.

(10) Patent No.: US 8,415,086 B2
(45) Date of Patent: Apr. 9, 2013

(54) METHOD OF STUDYING CHIRALITY CONTROLLED ARTIFICIAL KAGOME SPIN ICE BUILDING BLOCKS

(75) Inventors: Laura Heyderman, Zofingen (CH); Elena Mengotti, Zürich (CH); Danilo Zanin, Barbengo (CH); Rajesh Chopdekar, Zürich (CH); Hans-Benjamin Braun, Winterthur (CH); Remo Hügli, Wolfwil (CH); Gerard Duff, Shannon (IE)

(73) Assignee: Paul Scherrer Institut, Villigen (CH)

( * ) Notice: Subject to any disclaimer, the term of this patent is extended or adjusted under 35 U.S.C. 154(b) by 7 days.

(21) Appl. No.: 13/087,747

(22) Filed: Apr. 15, 2011

(65) Prior Publication Data

US 2012/0171619 A1 Jul. 5, 2012

Related U.S. Application Data

(60) Provisional application No. 61/324,332, filed on Apr. 15, 2010.

(51) Int. Cl.
*G03C 5/00* (2006.01)
*G03F 7/20* (2006.01)
*G11C 11/00* (2006.01)
*G11C 13/00* (2006.01)

(52) U.S. Cl.
USPC ............ 430/296; 430/311; 430/942; 365/151

(58) Field of Classification Search ................... 430/296, 430/311, 942; 365/129, 151, 244
See application file for complete search history.

(56) References Cited

U.S. PATENT DOCUMENTS

| | | | | |
|---|---|---|---|---|
| 5,613,140 A * | 3/1997 | Taira | ............................... | 257/14 |
| 6,118,686 A * | 9/2000 | Taira et al. | ..................... | 365/129 |
| 6,156,273 A * | 12/2000 | Regnier et al. | .................. | 422/70 |
| 6,166,948 A * | 12/2000 | Parkin et al. | .................. | 365/173 |
| 6,392,914 B1 * | 5/2002 | Kuroki et al. | ................. | 365/118 |
| 6,627,748 B1 * | 9/2003 | Ju et al. | ............................ | 506/15 |
| 6,867,429 B1 * | 3/2005 | Lutz | ............................... | 257/40 |
| 6,985,276 B2 * | 1/2006 | Taguchi et al. | ................ | 359/280 |
| 6,988,058 B1 * | 1/2006 | Sherwin et al. | ................... | 703/1 |
| 7,488,819 B2 * | 2/2009 | Manabe et al. | ............... | 540/472 |
| 8,085,578 B2 * | 12/2011 | Heyderman et al. | .......... | 365/151 |
| 2003/0017364 A1 * | 1/2003 | Kikitsu et al. | ................ | 428/693 |
| 2004/0028598 A1 * | 2/2004 | Harneit et al. | ............ | 423/445 B |
| 2004/0166673 A1 * | 8/2004 | Hutchison et al. | ............ | 438/686 |
| 2005/0037825 A1 * | 2/2005 | Faranda Cordella et al. | .......................... | 455/575.9 |
| 2005/0128842 A1 * | 6/2005 | Wei | ............................... | 365/205 |
| 2007/0258161 A1 * | 11/2007 | Richter et al. | .................. | 360/48 |

* cited by examiner

*Primary Examiner* — Christopher Young
(74) *Attorney, Agent, or Firm* — Laurence A. Greenberg; Werner H. Stemer; Ralph E. Locher

(57) ABSTRACT

A method is provided for achieving low energy states for the study of chirality kagome spin ice structures, the method having the steps of providing a silicon substrate; spin coating a polymethyl acrylate resist on said silicon substrate; providing an electron beam writer; exposing said coated substrate to an electron beam from said electron beam writer; positioning more than one thin island ferromagnetic island structure along a honeycomb lattice of said kagome spin ice component, wherein said positioning being along a determined magnetization direction of said lattice and wherein said island structures providing a mechanism in which chirality is controlled.

9 Claims, 19 Drawing Sheets

FIG. 2.1

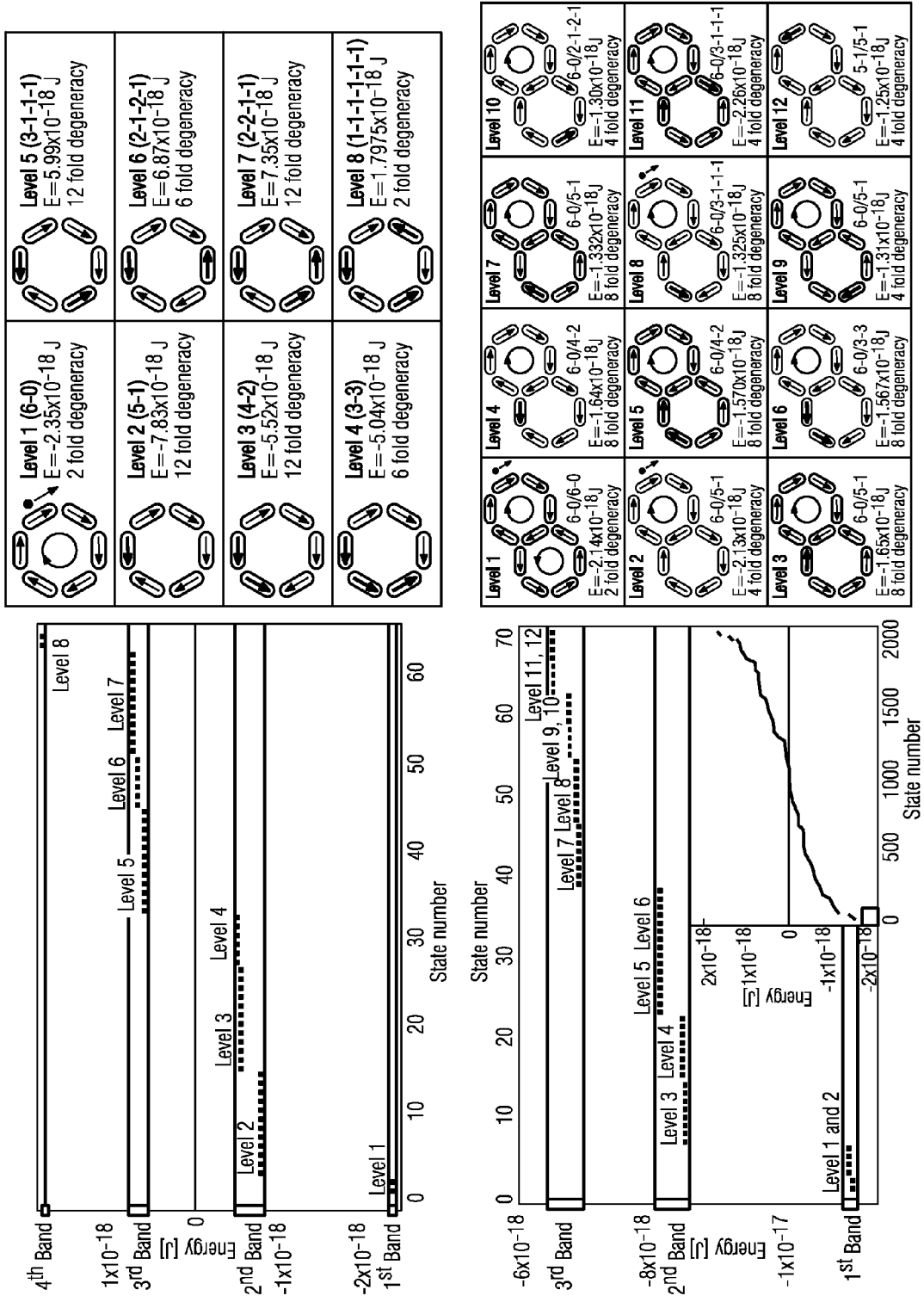
FIG. 2.2

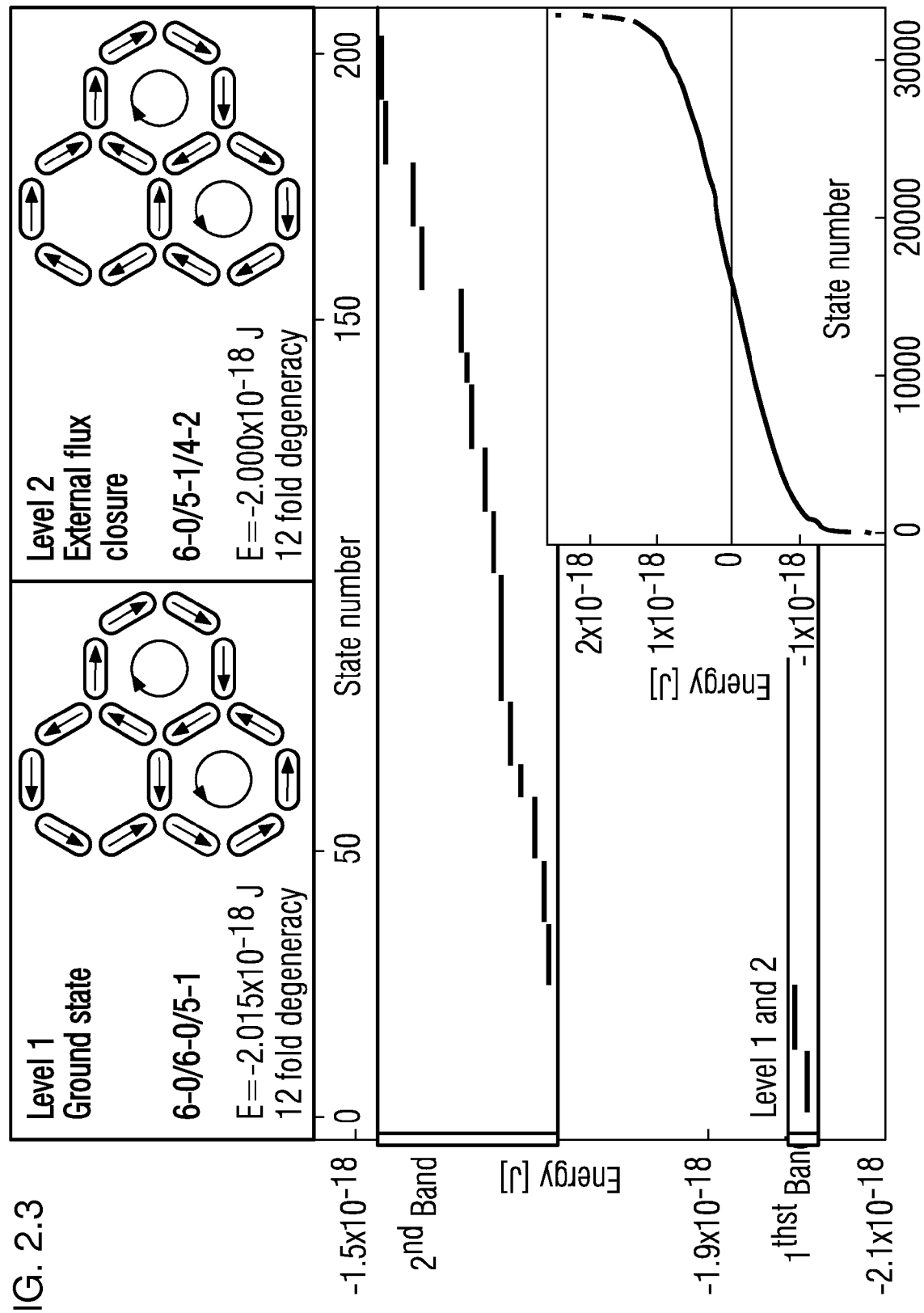
FIG. 2.3

FIG. 3.1
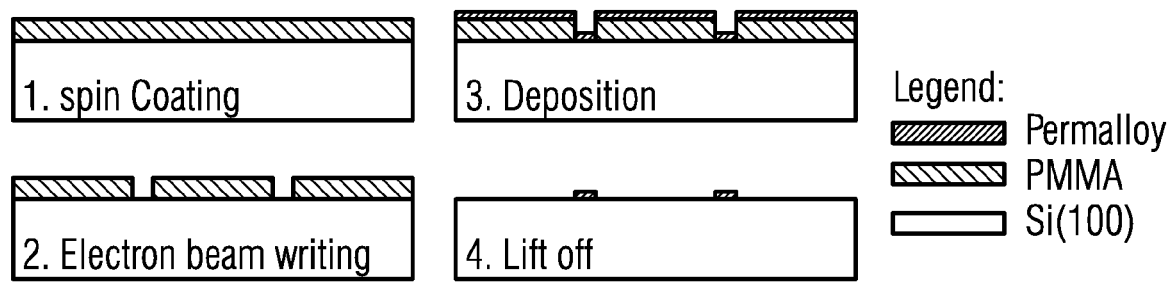
FIG. 3.2
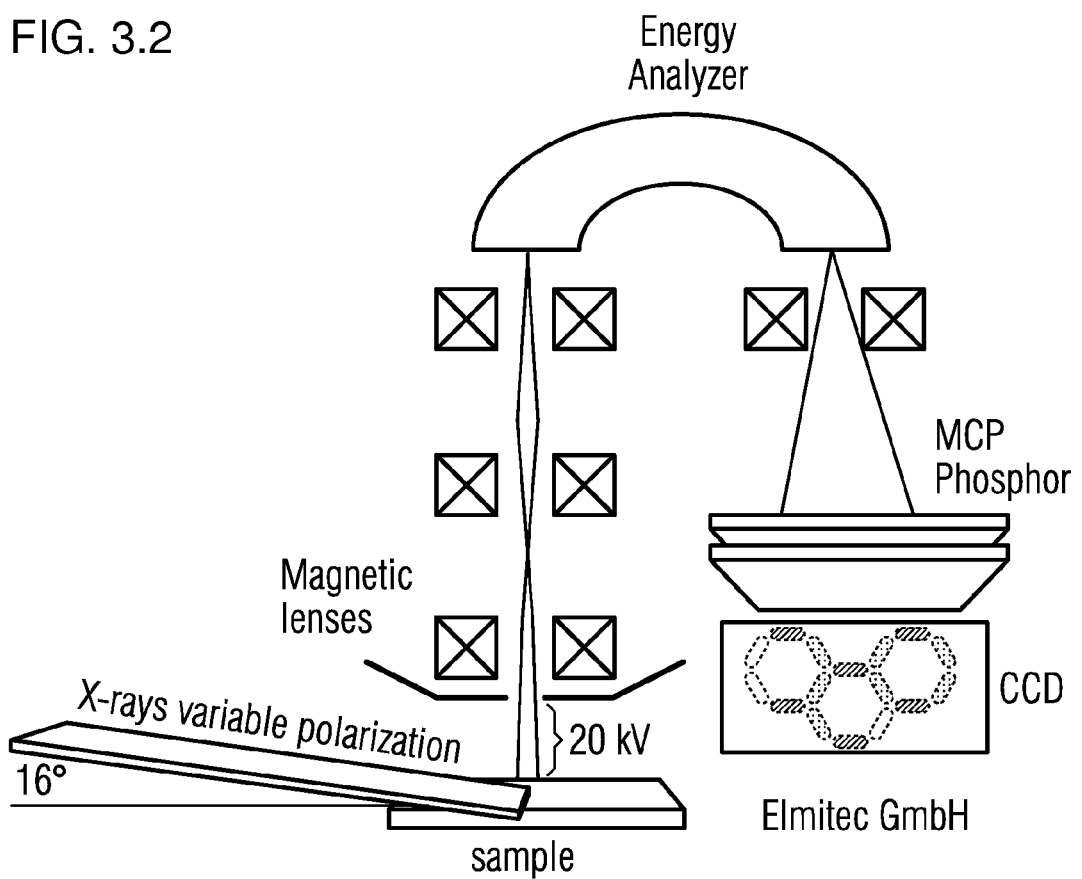

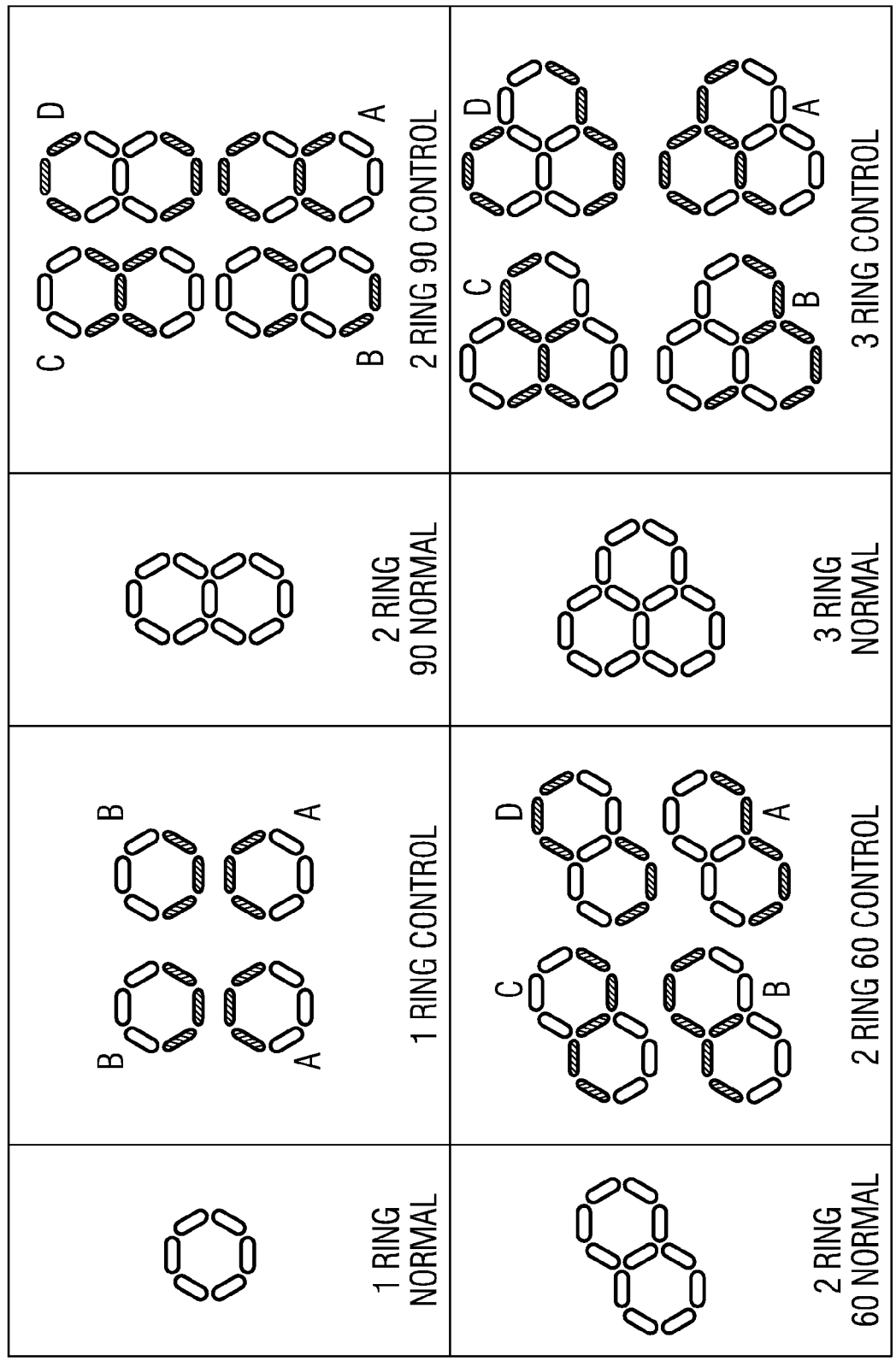
FIG. 4.1

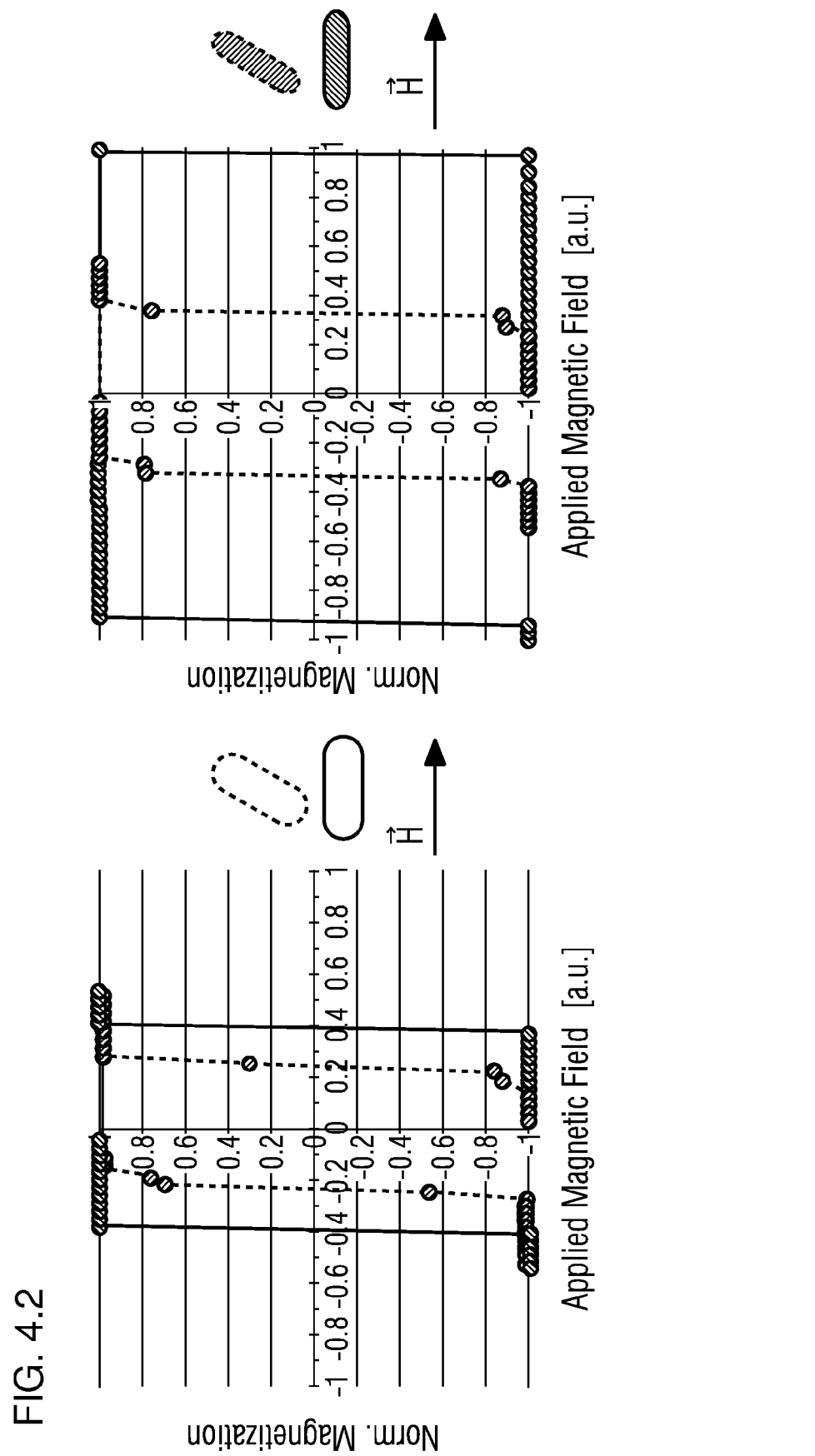
FIG. 4.2

FIG. 4.3
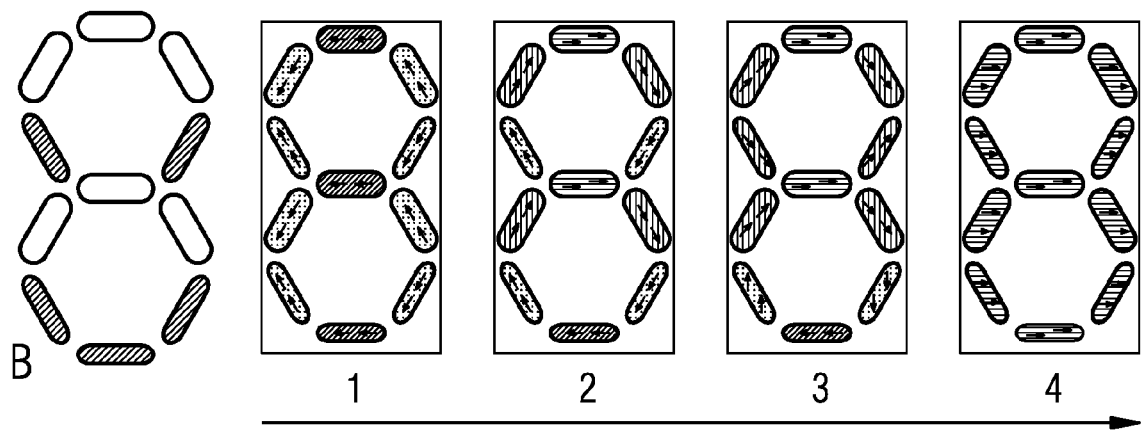
FIG. 4.4
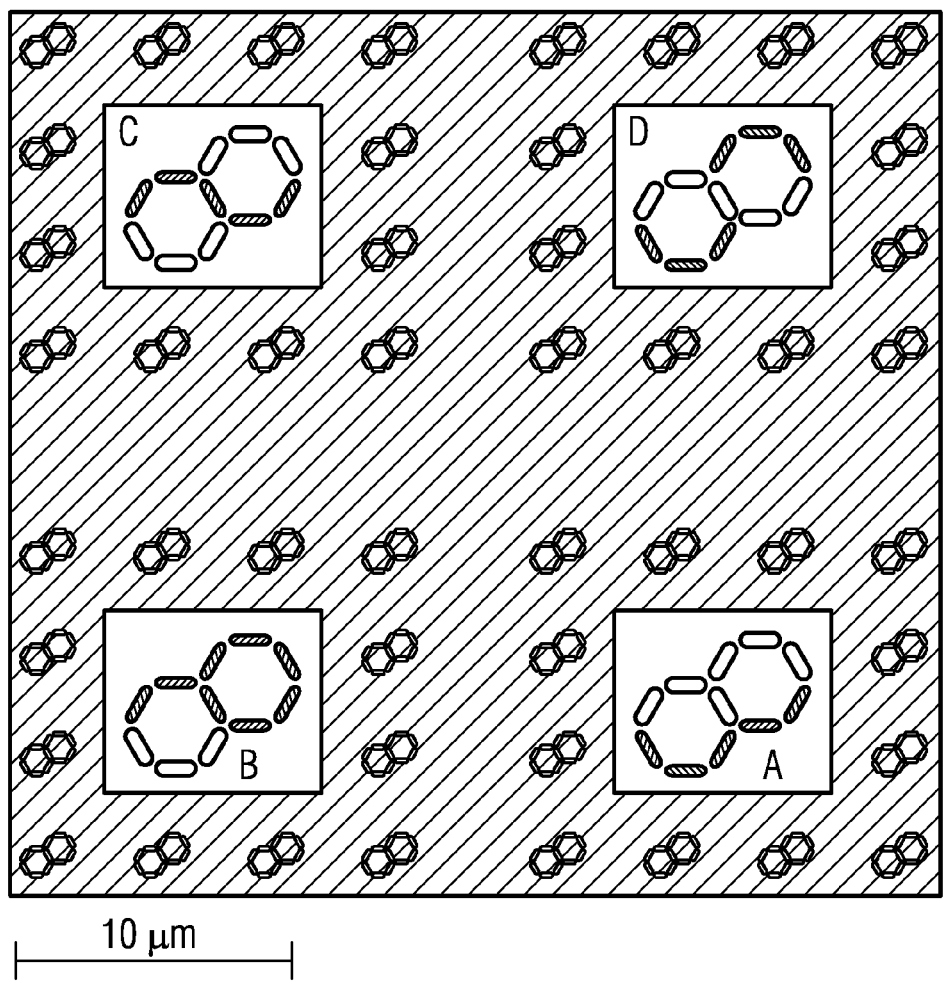

FIG. 4.5
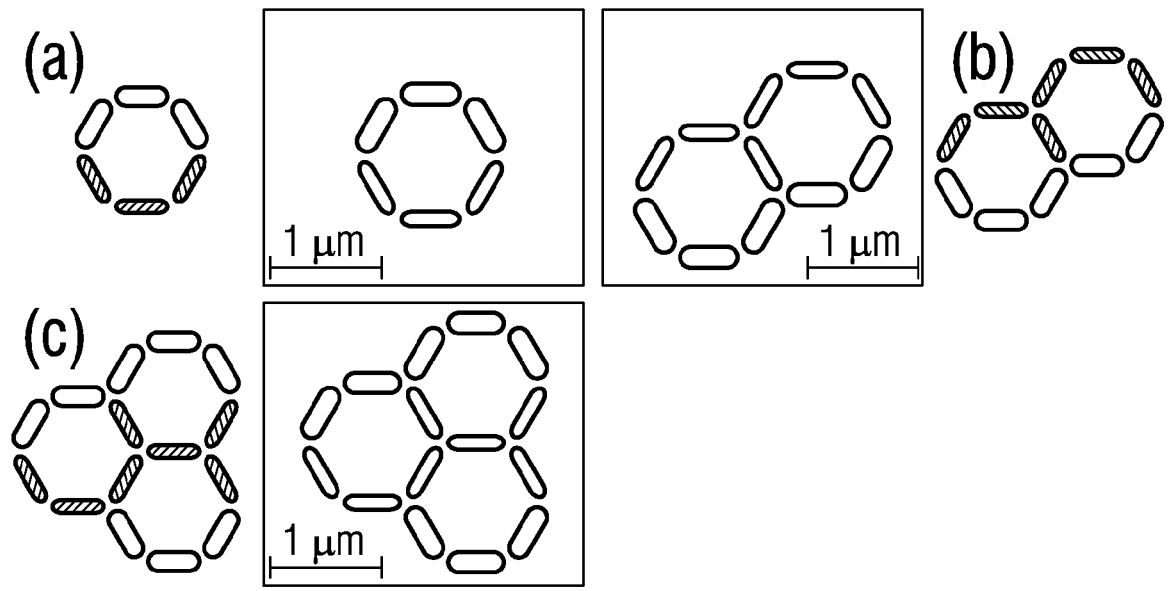
FIG. 4.6
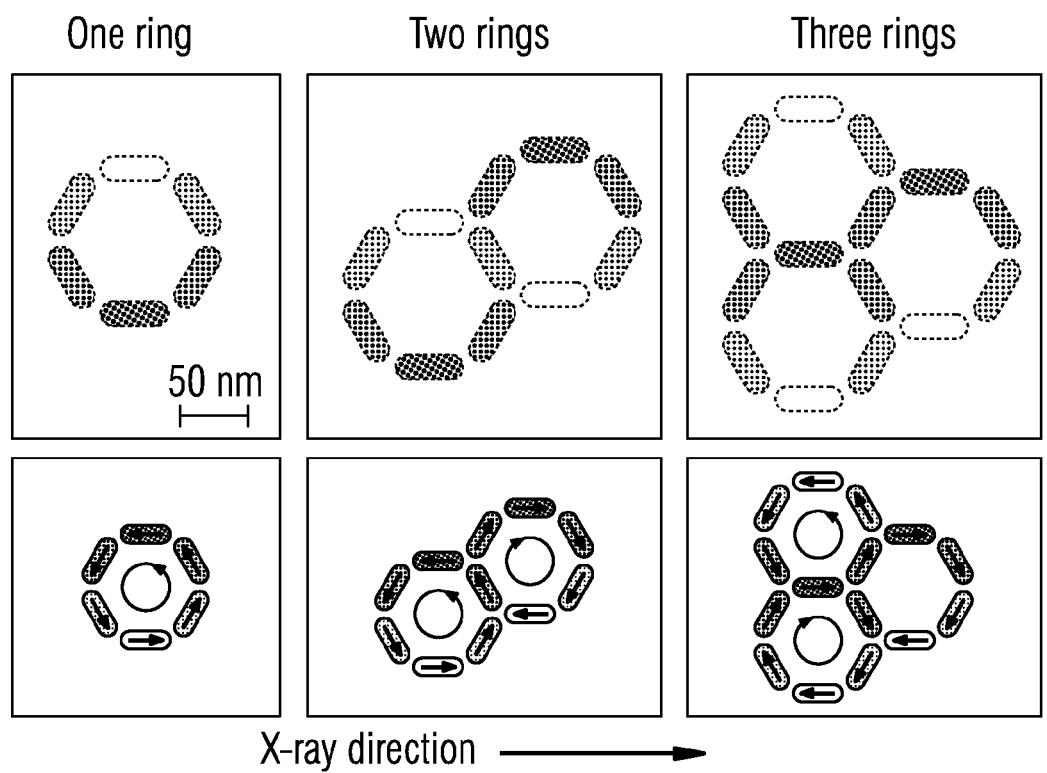
X-ray direction →

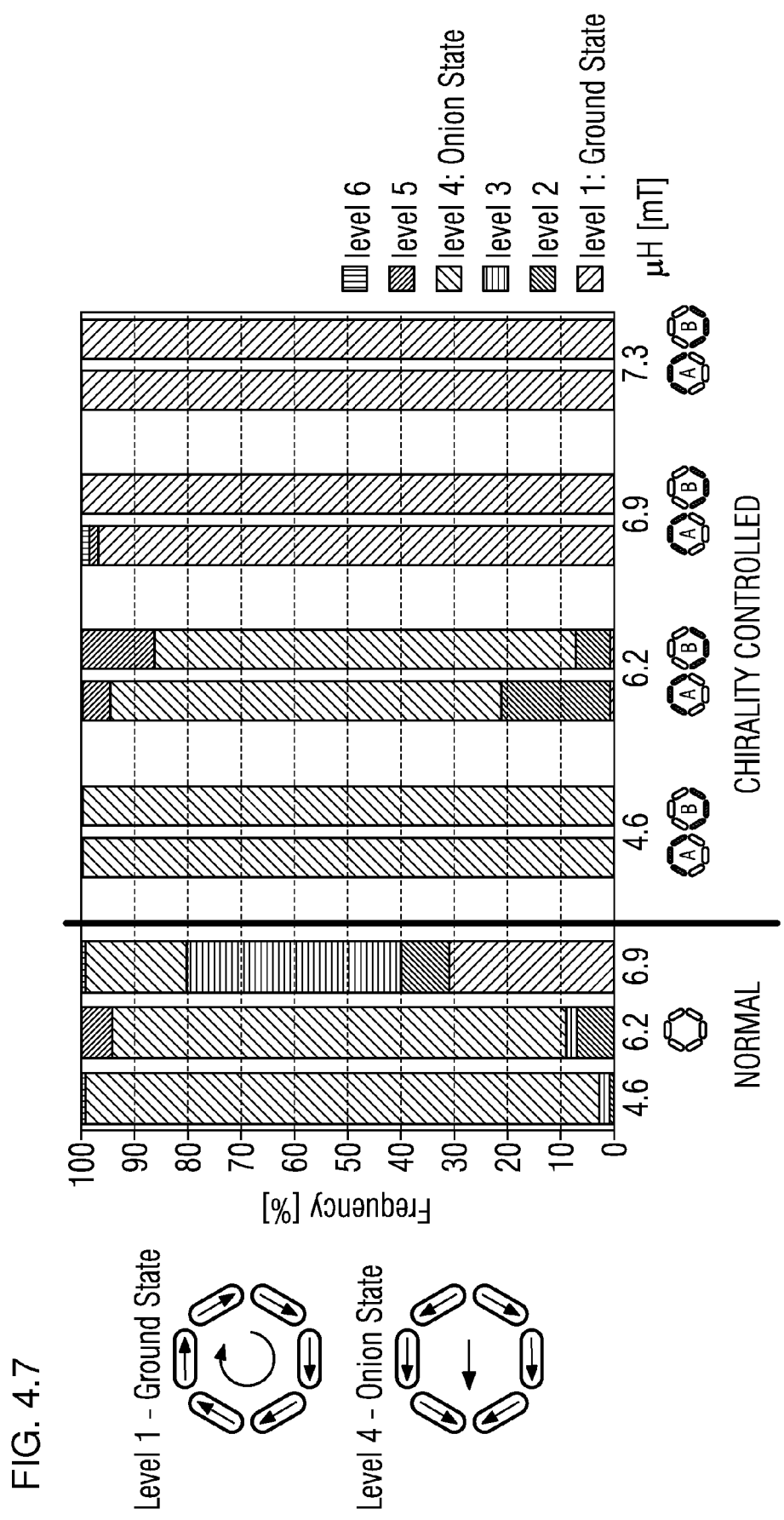

FIG. 4.8
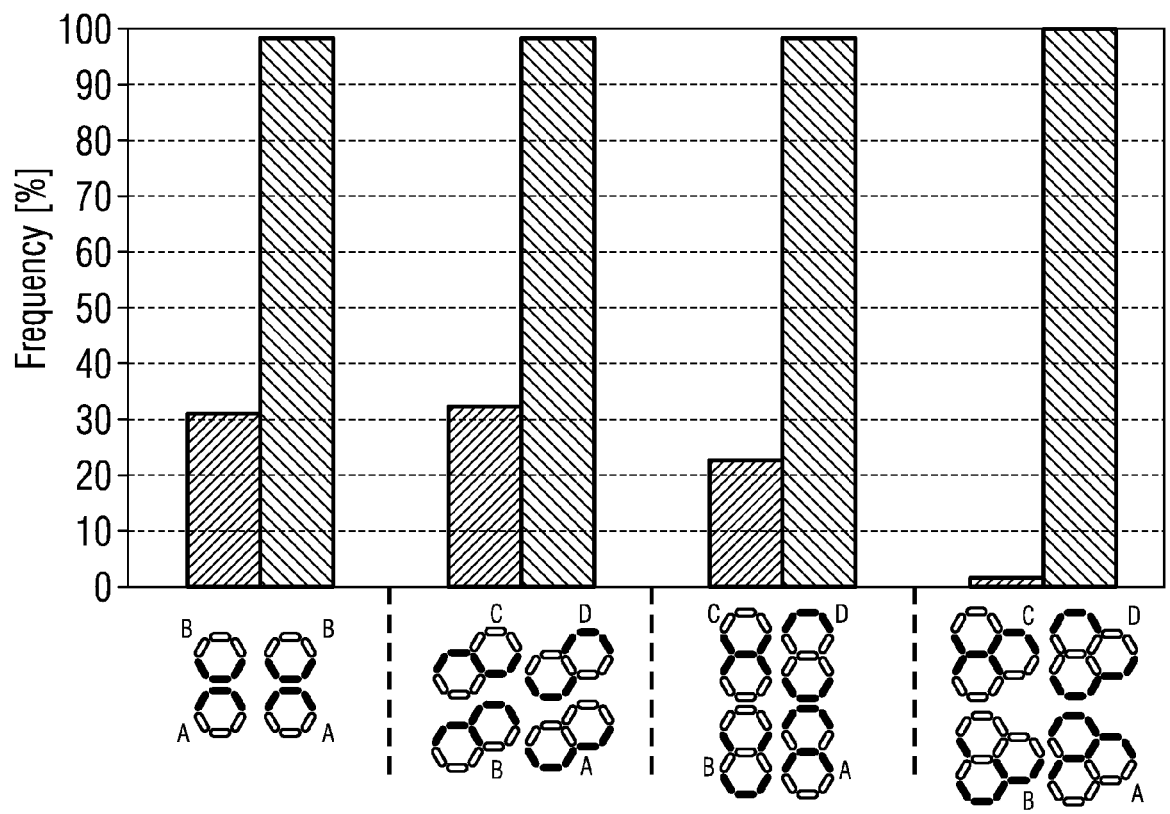

FIG. 4.9
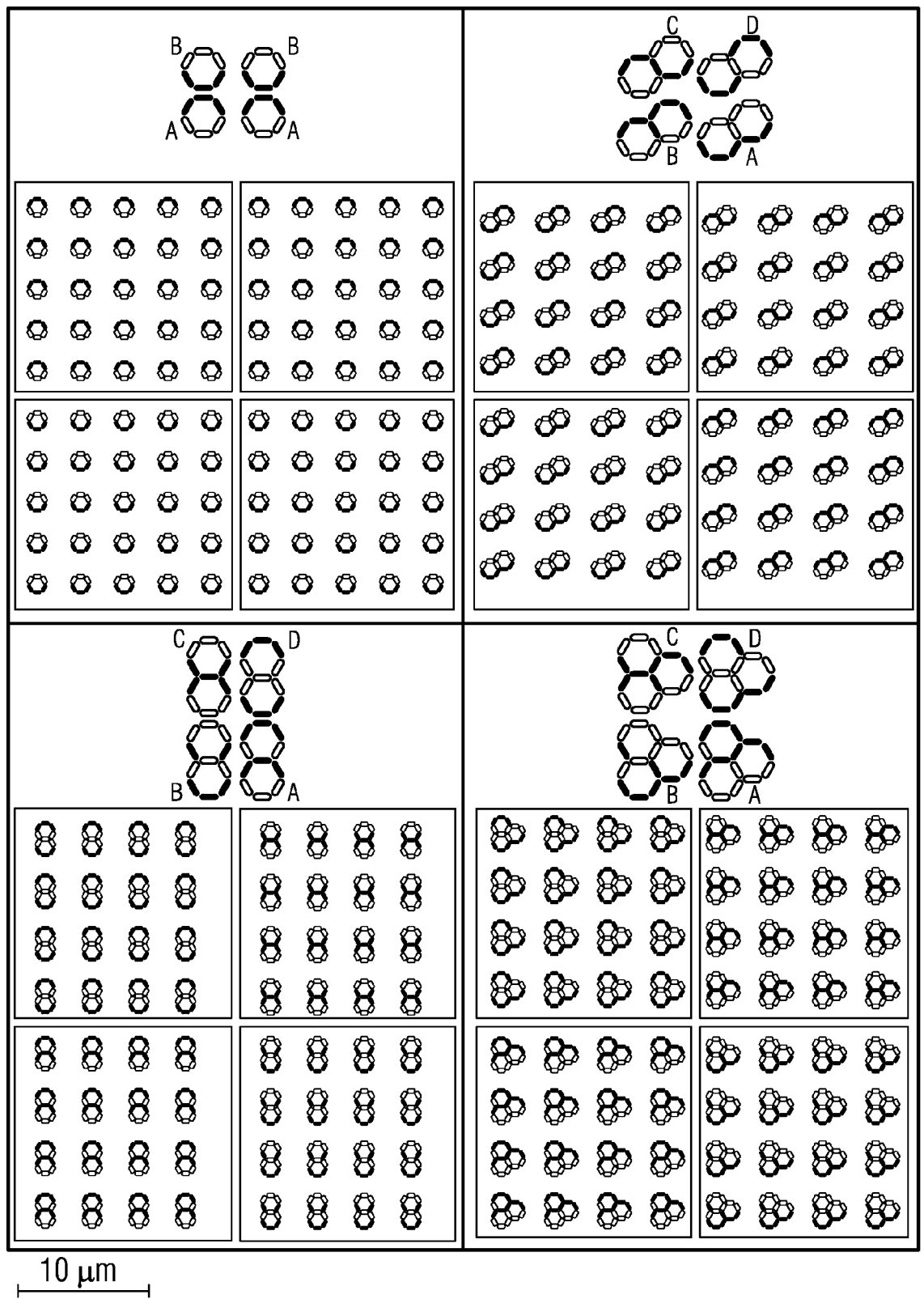
10 μm

FIG. 4.10
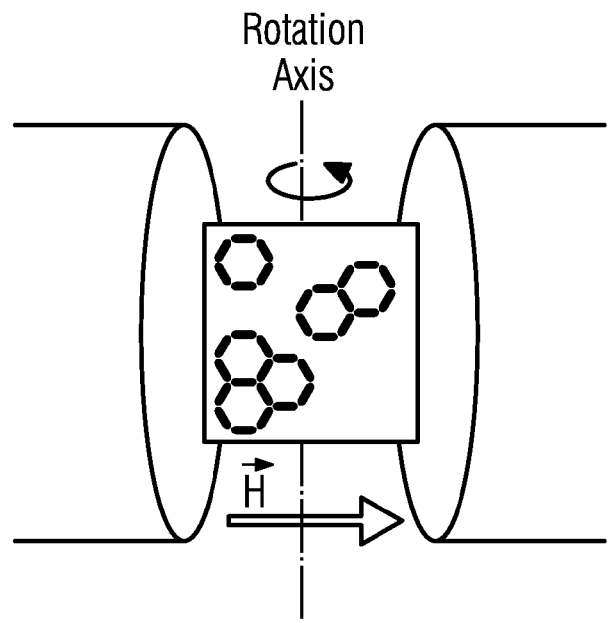
FIG. 4.11
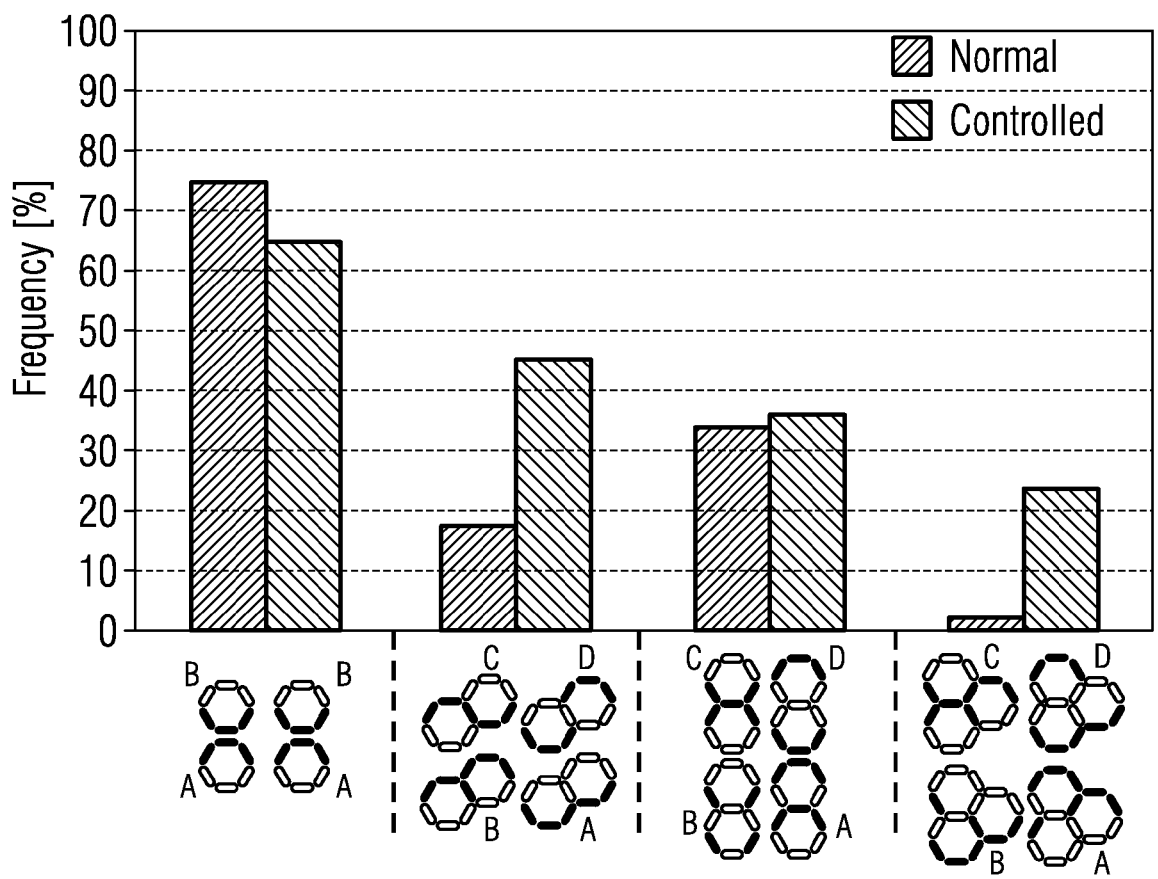

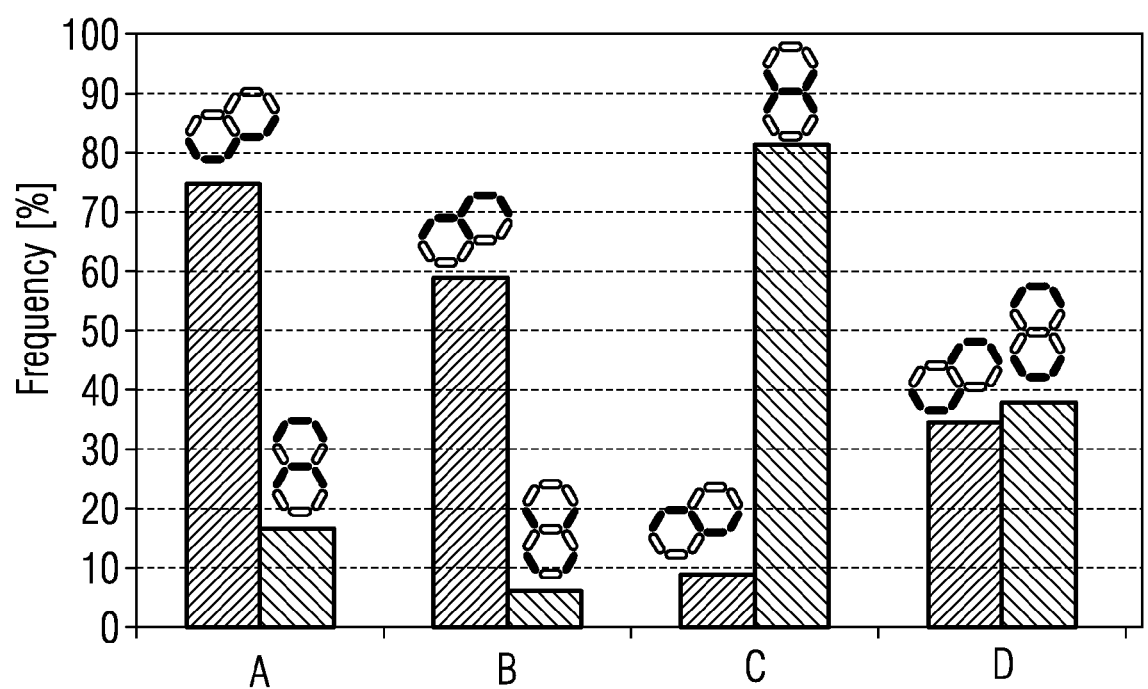
FIG. 4.12

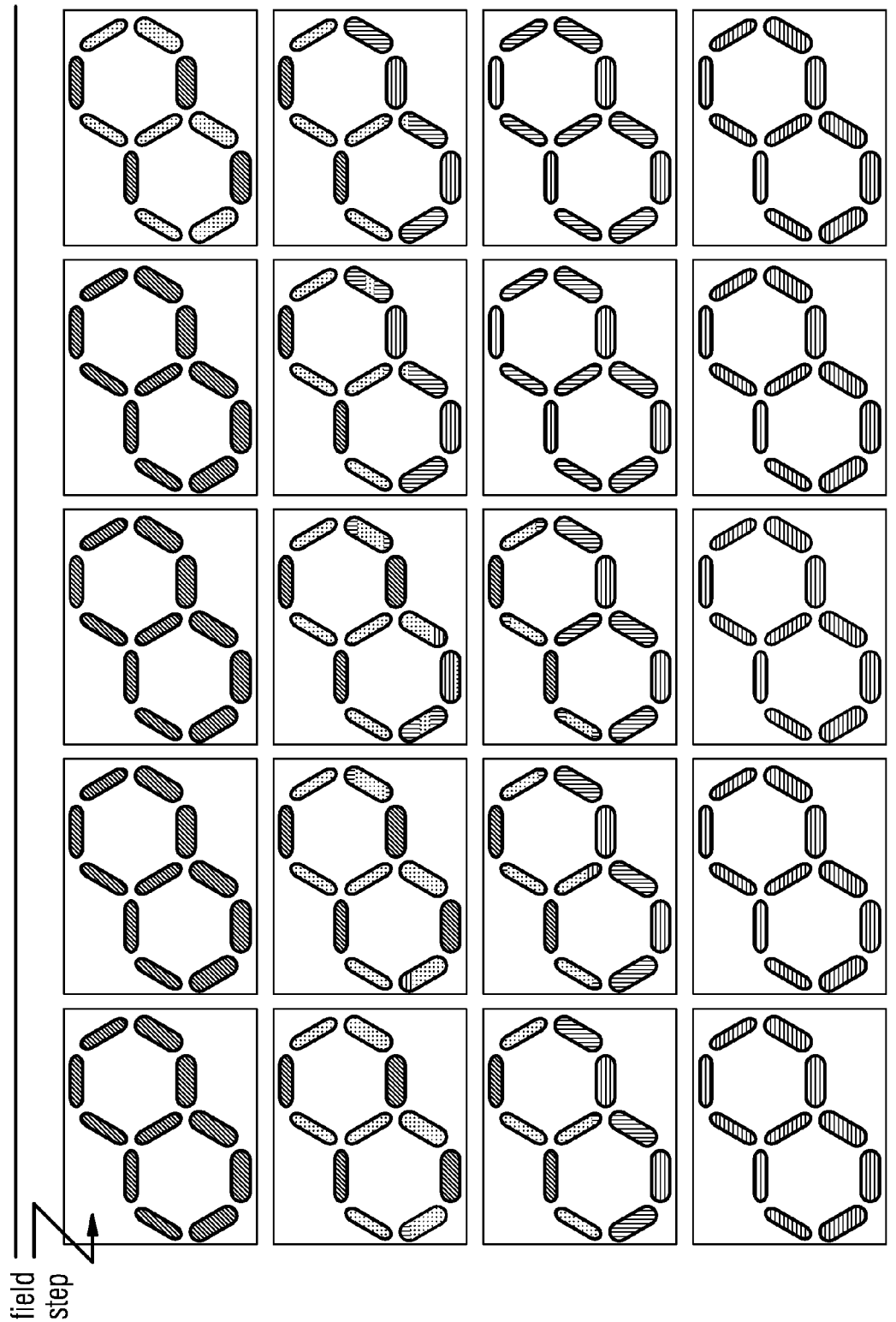
FIG. 4.13

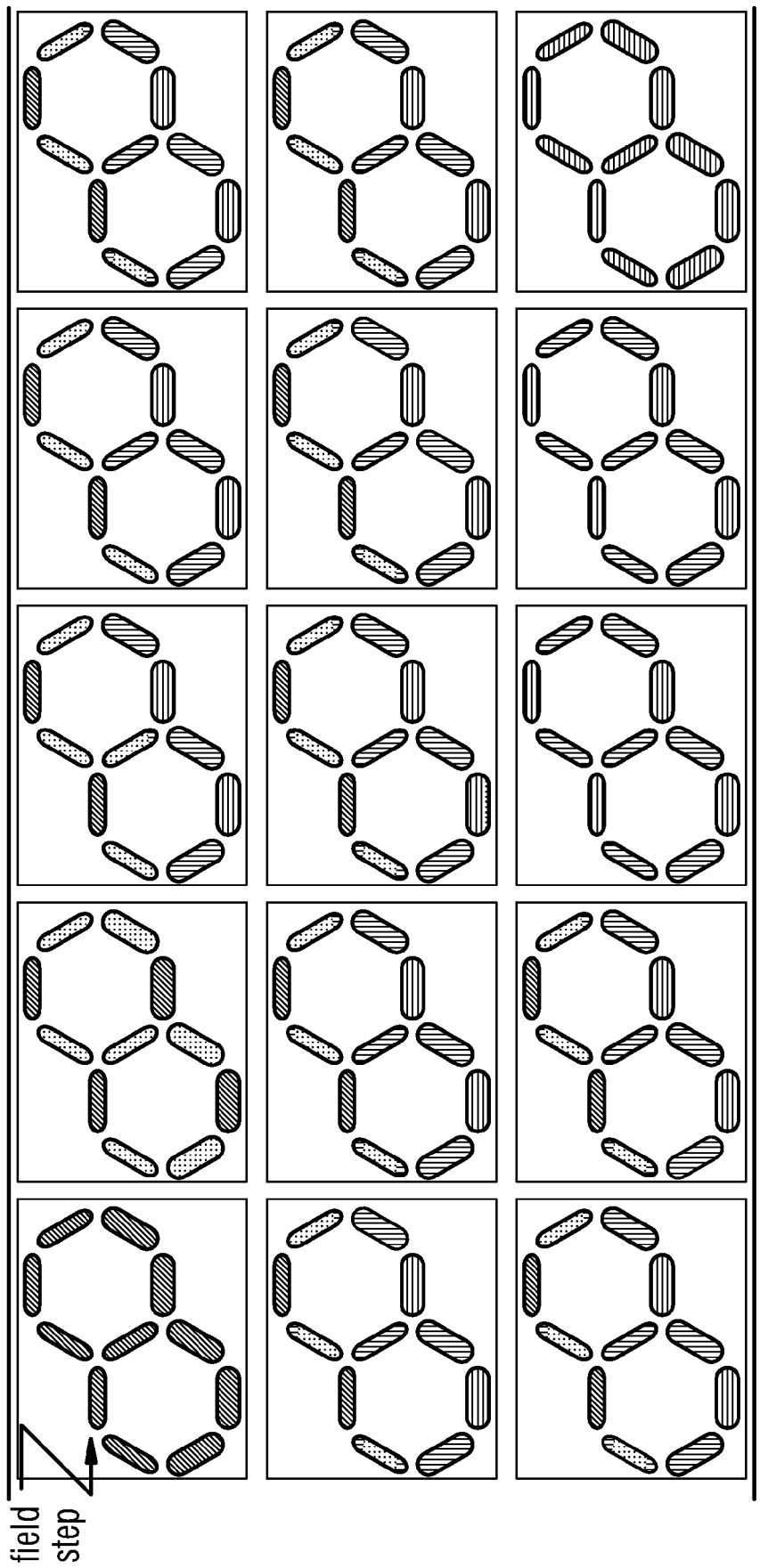
FIG. 4.14

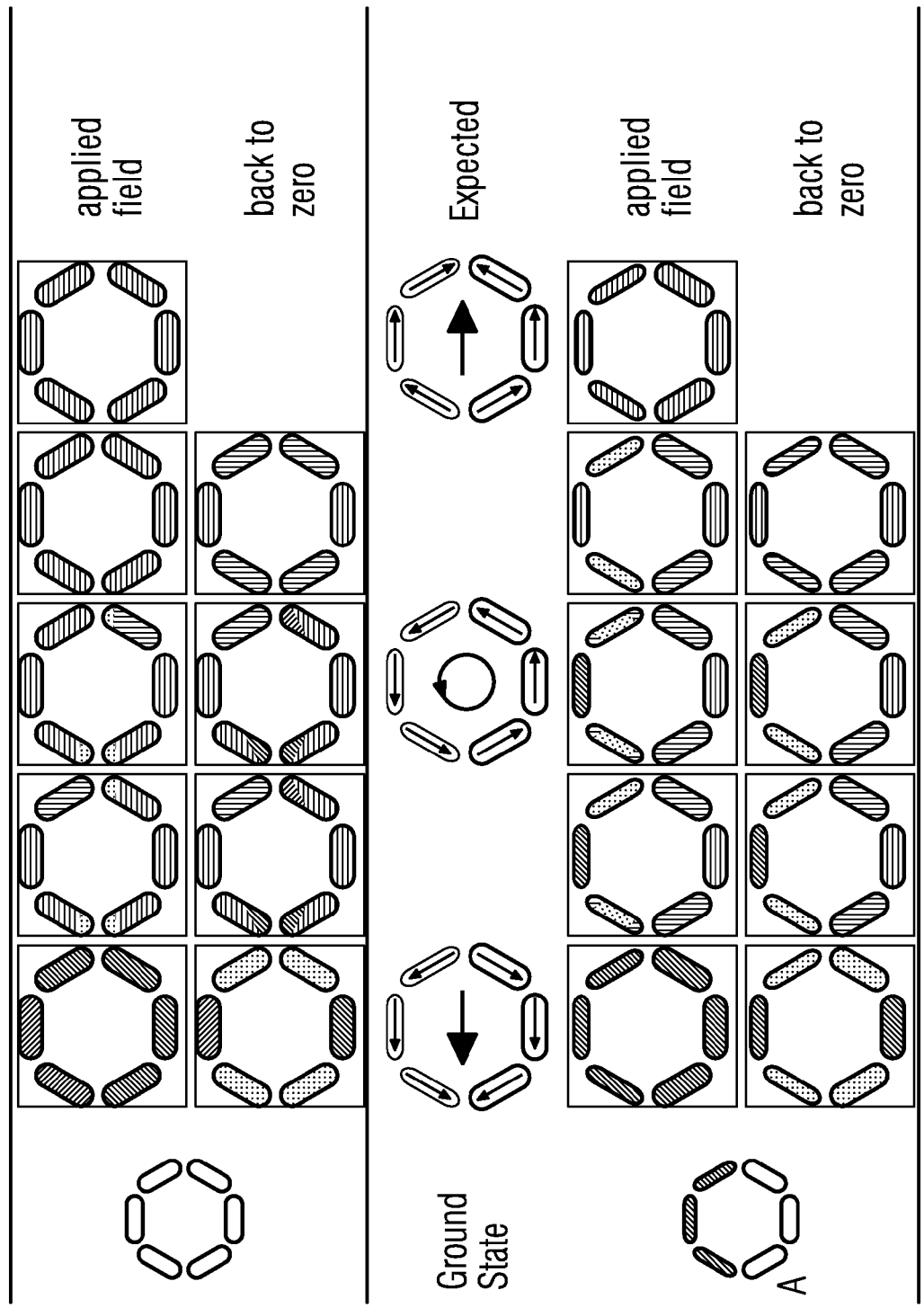
FIG. 4.15

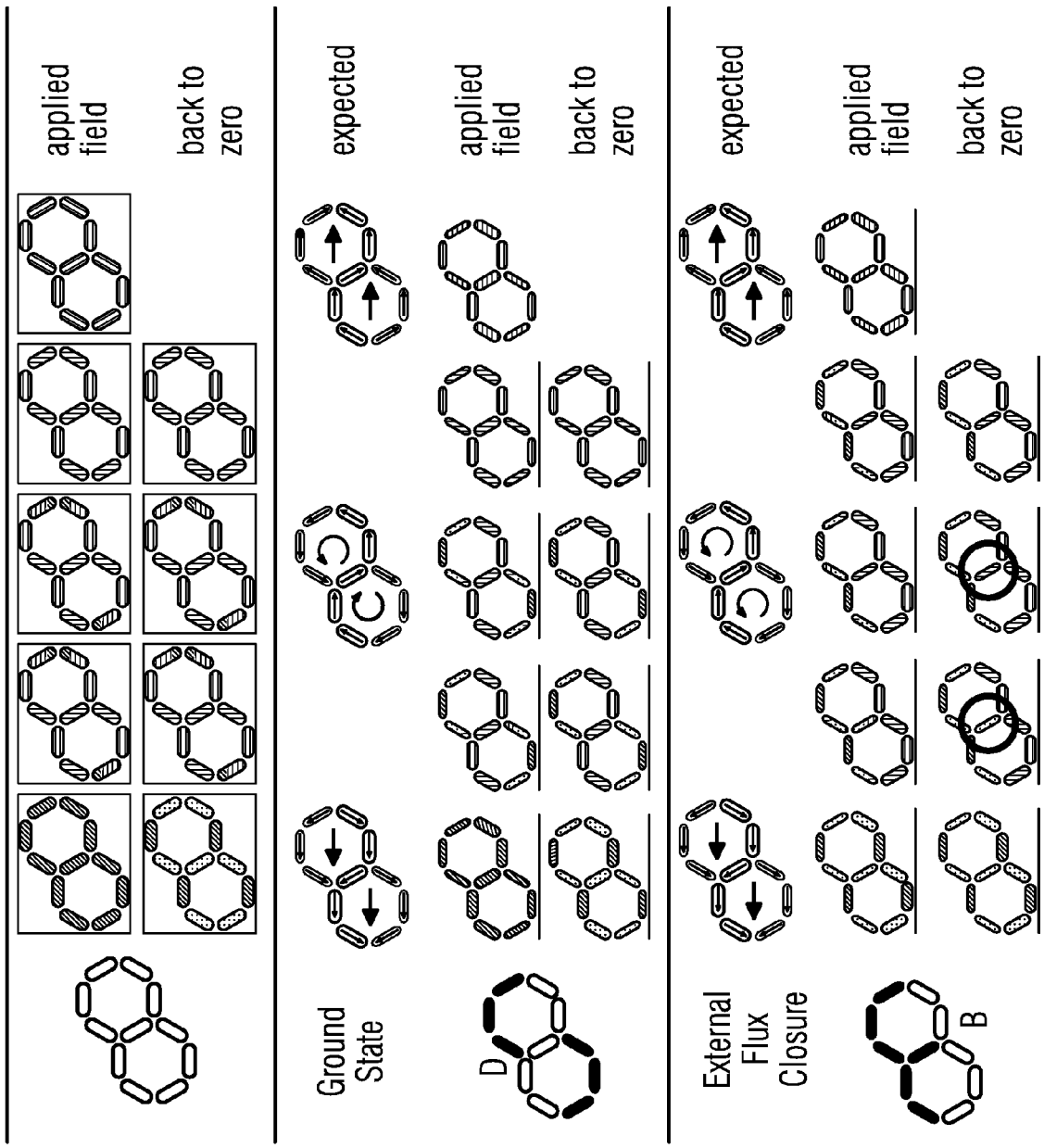
FIG. 4.16

FIG. 4.17
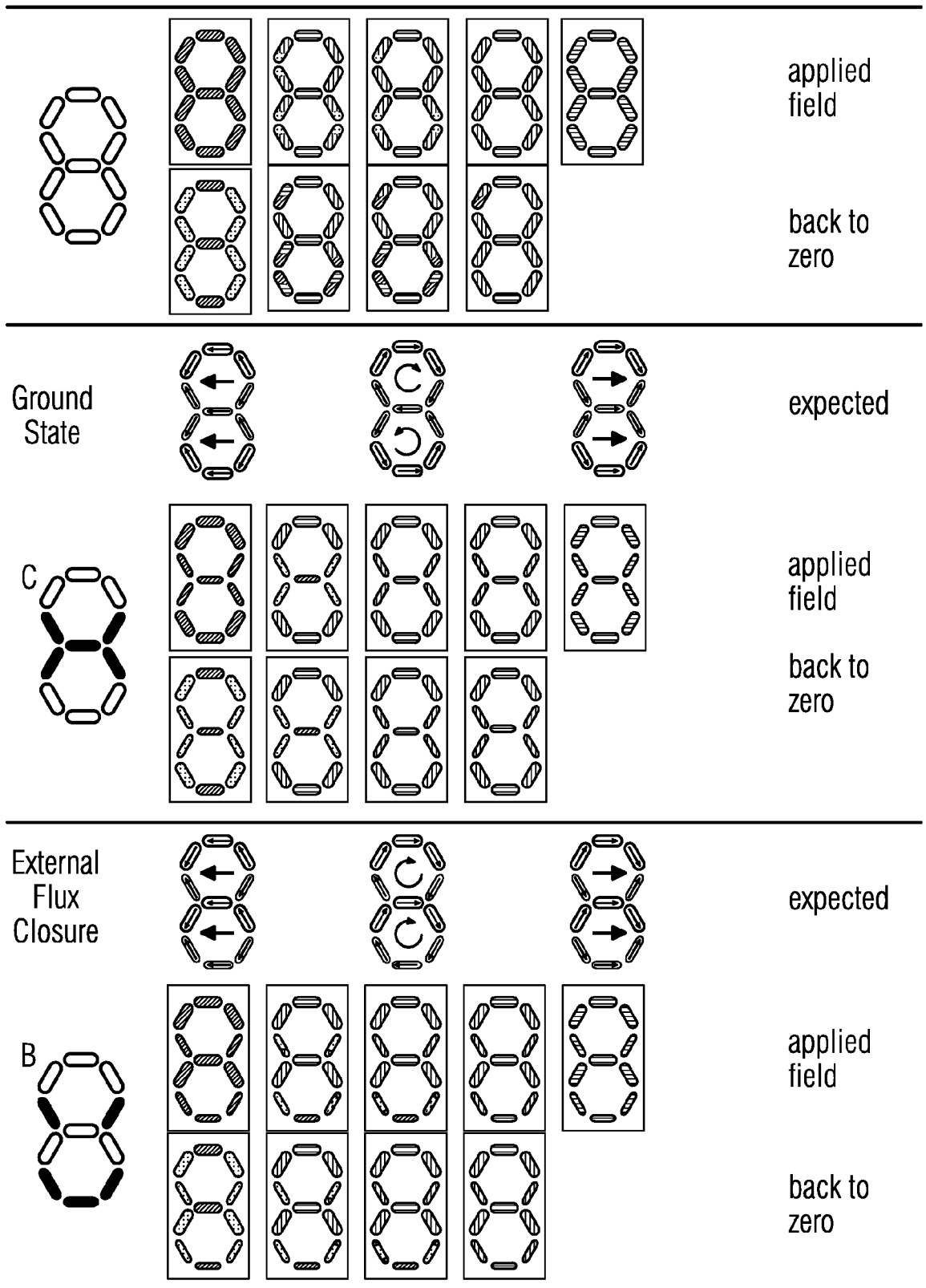

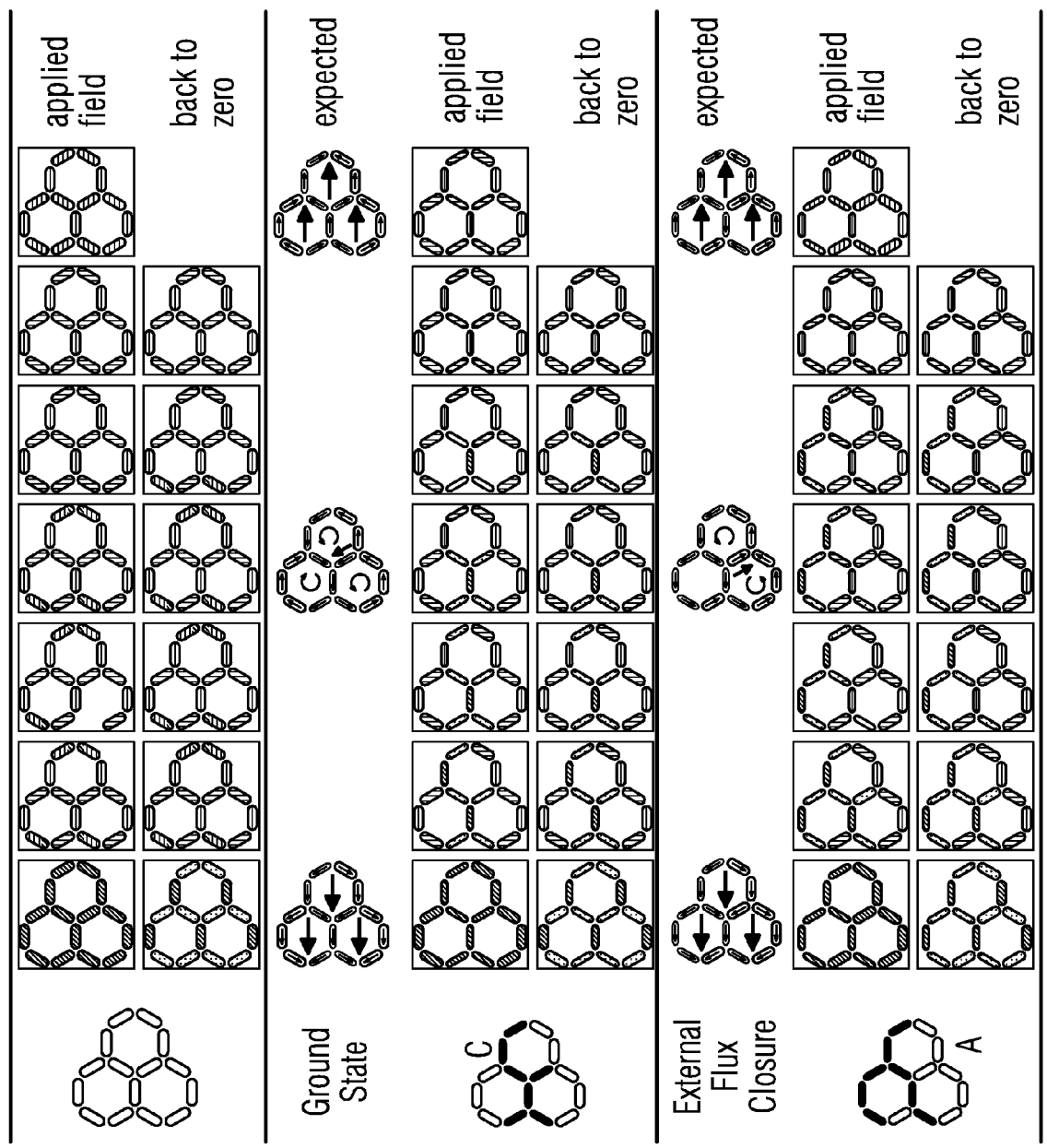
FIG. 4.18

METHOD OF STUDYING CHIRALITY CONTROLLED ARTIFICIAL KAGOME SPIN ICE BUILDING BLOCKS

CROSS-REFERENCE TO RELATED APPLICATION

This application claims the priority, under 35 U.S.C. §119 (e), of provisional application No. 61/324,332 filed Apr. 15, 2010; the prior application is herewith incorporated by reference in its entirety.

BACKGROUND OF THE INVENTION

Field of the Invention

Effects that comes from artificially made ferromagnetic elements which are coupled with each other dipolarly can lead to interesting field of scientific research. A good example is given by the work of Elena Mengotti et al. on the kagome spin ice building blocks incorporated herein by reference in its entirety (Elena Mengotti et al. Building blocks of an artificial kagome spin ice: Photoemission electron microscopy of arrays of ferromagnetic islands. *Physical Review*, B 78:144402, 2008). The cited Mengotti article explains how dipolar energy calculations can be used to fully characterize the finite energy landscape of kagome spin ice building blocks. With the above mentioned energy calculation, the lowest energy states can be identified together with its degeneracy degree. The investigated structures in the cited Mengotti article are created by state-of-the art lithography techniques and are oriented in a particular geometry that is highly frustrated: the kagome spin ice geometry. Each of the investigated building blocks is composed by identical small islands placed on the cite of the kagome geometry. These islands are small enough so that no domain wall is present, meaning that the islands are in a single domain and the magnetization direction points along the long axis. For these reasons, the dipolar calculation can be applied. Using photo emission electron microscopy, Elena Mengotti et al. show experimentally that on demagnetization the ice rule at a three islands vertex (i.e. 2 in-1 out or 1 in-2 out) is always obeyed even at low dipolar coupling and that on increasing the number of rings in the building blocks, meaning on introducing more frustration in the system, the ability to achieve the lowest energy state decreases drastically. So far the control of the degenerate low energy states achieved was not present for both cases: the demagnetization process and the in-situ reversal. In other words the frequency of the achieved low energy state (i.e. vortex state) with a given chirality in the one-ring kagome structure during in-situ magnetization reversal was purely random. With the help of lithography, some islands composed of the building blocks can be changed quite easily. By introducing some asymmetry in the structures, the goal of the present invention is to increase the frequency of low energy state upon in-situ magnetization reversal and also to control the chirality of those particular states. These modifications that concern particularly the width of the islands will affect the switching properties and the coercivity field of the element is therefore either high for thin islands or rather low for the wider one. Choosing the right geometry one can genuinely create some preferential channel for the demagnetization process and control the reversal process in a better way. In order to confirm experimental results in the present invention, some simulation using the Object Oriented Micro Magnetic Frame-work incorporated herein by reference in its entirety (M. J. Donahue and D. G. Porter. OOMMF User's Guide, Version 1.0, September 1999.) have been carried out. A significant frequency increase in the right energy state channel during the in-situ magnetization reversal is present and also an increase in the ability to achieve the low energy state after the demagnetization process. The present invention is a first step toward the highly interesting use of these finite multistate kagome structures for future spintronic devices, either for memory applications or to perform logic operations. One still needs to find a completely reproducible way to read and write on each building block structure (particular configuration from the many possible from the energy landscape). The present invention proves that one can access successfully up to 6 energy configuration of the 2N possible ones.

This section will explain shortly the property of a kagome lattice and provide a description of the different energy state for the investigated building block structures.

2.1 Kagome Lattice.

The term kagome comes from the Japanese word meaning bamboo basket (kago) made from a woven pattern (me).

FIG. 2.1 represents a kagome lattice in red. The magnetic moments (shown in black) are placed on the edge of the triangles composing the lattice. A lattice constraint force the spin to point along the connection between the center of two neighbors triangles. The most important characteristic of this geometry is that it is highly frustrated and the three interactions at a three island vortex are equivalent. Frustration is there since at every vertex where three magnetic moment interact, all the involved dipolar interaction can not be satisfied simultaneously. Nevertheless there is a most favorable configuration which is given by the spin ice rule. The spin ice rule dictates that either two moments point into the triangle center and one points away from the vertex (two-in/one-out), or vice-versa (one-in/two-out).

The artificial ferromagnetic islands used in this work are so small that they have a single domain magnetization and therefore they can be approximated by a single macroscopic spin. The small elongated ferromagnetic elements are placed on the cites of the kagome lattice along the magnetization direction forming a honeycomb lattice. More about kagome spin ice can be fond in the work of Ballou incorporated herein by reference in its entirety (R. Ballou A. S. Wills and C. Lacoix. Kagome spin ice. Physical review, B 66:144407, 2002).

2.2 Energy State

The definition of the energy states for the kagome spin ice geometry building blocks is fundamental in order to interpretate the experimental observation. The energy can be calculated using the dipolar energy, which for two island is given by the equation (equation 2.1):

$$E(\vec{r}_1, \vec{r}_2, \vec{m}_1, \vec{m}_2) = \frac{1}{\|\vec{r}\|^3}\left[\vec{m}_1 \cdot \vec{m}_2 - \frac{3}{\|\vec{r}\|^2}(\vec{m}_1 \cdot \vec{r})(\vec{m}_2 \cdot \vec{r})\right]$$

where $\vec{m}_1$ and $\vec{m}_2$ are the magnetic moments of the two interacting islands and $\vec{r}$ is the distance between the centers of the islands. In our experiment the distance between the centers of the nearest islands is 500 nm and the magnetization is in the order of 108 µB(10-16 Am2). This give an interaction energy of 10-18 J between nearest neighbors. Taking into account the shape anisotropy, the moment is set in one of two directions parallel to the long axis of the island, there are 2N possible configurations, where N is the number of islands composing the building block.

FIGS. 2.2 and 2.3 illustrate the calculated value from the work archived by E. Mengotti et al. for an artificial kagome spin ice geometry with identical islands made of cobalt. The material and the geometry of some islands will be different, this will anyway not affect the configuration of the possible state as well as the configuration order. A slight shift in the energy axis may occur. For the one-ring kagome structure, six islands are present resulting in $2^6=64$ possible states and the energy levels are grouped in four bands, as illustrate in FIG. 2.2. The minimum (the maximum) dipolar energy occurs when neighboring moments are aligned head-to-tail (head-to-head or tail-to-tail). Therefore the ground state of a single ring consists of moments circulating either clockwise or anticlockwise. For the two-ring kagome structure, many more states are present ($2^{11}=2048$), and frustration is introduced at two vertices with three interacting islands oriented at 120° to each other. The ground state with a twofold degeneracy consists of two vortices with opposite chirality. The next lowest state (very close in energy to the ground state) is the "external-flux-closure". Here the outer magnetic moments form a chain of moments circulating (head-to-tail) either clockwise or anticlockwise around the whole two-ring structure, and the central island moment falls into one of the two possible directions resulting in a fourfold degeneracy. A summary of the first twelve energy state spin configurations is illustrated in FIG. 2.2. For the three-ring kagome structure, while two vortices are allowed, it is no longer possible to have three complete vortices. In total there are $2^{15}=32768$ state configurations. The lowest energy band consists of two discrete levels. Level 1 corresponds to the ground state which consists of two vortices with opposite chirality and a third not complete vortex. Level 2 is the "external-flux-closure" state with the outer magnetic moments forming a chain of moments circulating either clockwise or anticlockwise around the whole three-ring structure and the three moments in the middle of the structure following the ice rule. In FIG. 2.3 the state configurations for the first two energy levels and an overview of the whole energy landscape for the three-ring building block is illustrated.

FIG. 2.2: Left: Calculated dipolar energies of the 64 (2048) possible configuration if the one- (two-) ring building block. The energy values refer to 10 nm-thick cobalt islands with a=500 nm, W=200 nm, L=470 nm for the one- (two-) ring building block. Right: Schematic representation of one degenerate state for each of the one-ring building block and the first twelve of the two-ring building block energy levels. The states are ordered as a function of increasing energy and labeled (n-m), where n refers to the highest number of neighboring magnetic moments pointing in the same direction around the structure, and m is the number of neighboring magnetic moments pointing in the opposite direction, running clockwise from the starting point indicated with a dot and arrow. For higher states the nomenclature k-l-m-n is used to indicate the number of neighboring moments aligned in the same direction.

FIG. 2.3: Energy characterization of the three-ring kagome structure. Calculated dipolar energies of the lowest 204 energy states of the three-ring structure. The energies of all of the 32 768 possible states are shown in the inset. The lowest two energy states, which belong to the first energy band, are schematically shown at the top of the figure: the islands in the ground state are colored in blue, while the islands in external-flux-closure state are green.

SUMMARY OF THE INVENTION

Employing Photoemission Electron Microscopy (PEEM) together with X-ray magnetic circular dichroism (XMCD), the magnetic configurations in three basic building blocks of an artificial kagome spin ice consisting of one, two, and three ring structures during magnetization reversal as well as after demagnetization have been observed. The structures made with electron beam lithography were either made out of identical island size (called normal building blocks) or with some thinner islands (so-called chirality controlled structures).

Experimentally it is shown that an advantageous choice of the position of the thin, and therefore harder, islands inside the kagome spin ice structure increase very much the ability to achieve the low energy states. In fact, the frequency of achieved low energy states as well as the control on which particular state, of a series of degenerate ones, will be achieved during magnetization reversal has been significantly improved. Also remarkable is the fact that all the controlled building block reverse their magnetization in a pretty small field range. This behavior has been also reproduced using OOMMF simulations. This work opens to control of dipolar coupled island structures for future spintronic applications.

In one embodiment, the present invention is

A method for achieving low energy states of functionally coupled islands of a functional material, said functionally coupled island being places within a chirality kagome spin ice structure comprising a honeycomb lattice ring structure, each ring structure having six axis declined by an angle of about 60° one axis to the other, comprising the steps of;

a) providing a silicon substrate;

b) coating a photoresist material, such as a polymethyl acrylate resist, on said silicon substrate;

c) providing an electron beam writer or a photon beam writer;

d) exposing said coated substrate to an electron beam from said electron beam writer or to a photon beam of said photon beam writer, whereby said exposing forms geometric configuration being a kagome ring component having at least one ring structure; thereby breaking monomer chains of the polymethyl acrylate resist in said exposed region;

e) removing the broken monomer chains in order to achieve void islands and positioning in a variety of said void islands more than one functionally coupled island, each of the functionally coupled islands being oriented along one of the six axis of the honeycomb lattice ring structure of said kagome spin ice component,wherein the functionally coupled islands are substantially identical in length but differ in width;

f) said functionally coupled island structures providing a mechanism in which chirality is controlled according to the physical property of the functional material in the functionally coupled islands.

In the method of the present invention, the physical property of the functional material is selected from a group consisting of:

a) magnetic dipolar orientation providing a magnetic dipolar coupling;

b) electric dipolar orientation providing an electrical dipolar coupling;

c) ferro-electric orientation providing a ferro-electrical coupling;

d) filled vesicles interlinked by springs with tunable spring constants providing a mechanical coupling;

e) molecular orientation providing physical binding coupling;

f) molecular charge or spin orientation providing physical binding coupling as well;

g) chemical binding status providing coupling by the available coupling links; and h) light absorption polarization providing a coupling on plasmonic interactions through the supporting surface or matrix.

The island structures are separated by a distance of about 500 nm and impart an interaction energy of $10^{-18}$ J. between nearest structures. In a preferred embodiment the island structures have a substantially constant length.

Preferably, the vortex chirality of a kagome spin ice component is increased with size change of said functionally coupled islands.

Additionally, the width of the functionally coupled islands within the honeycomb lattice ring structure of said kagome spin ice component is alternating in order to avoid that two adjacent island have the same width.

In one embodiment, the first subgroup of said island structures have a first width and a second subgroup of said island structure have a second width, wherein the first width is greater than the second width.

The first width ranges from 100 to 500 nm and the second width ranges from 50 to 200 nm; thereby observing that the first width has to be greater that the second width.

A particular distinguishing feature over the prior art is the fact that the functional island change in size within the same honeycomb structure. Thereby, the island show a different behaviour with respect to their physical property and with respect to the energy required to change the status of a functionally coupled island from a first state into a second state, for example to change the direction of the ferromagetic magnetization. Therefore, the low energy states of the kagome spin ice structure can be controlled in a preciser and more predictable way allowing to store information in the kagome spin ice structure more precisely and more predictably.

Other features which are considered as characteristic for the invention are set forth in the appended claims.

Although the invention is illustrated and described herein as embodied in a method of studying chirality controlled artificial kagome spin ice building blocks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 2.1 is a schematic representation of a 2D kagome spin ice structure represents a kagome lattice in red, and magnetic moments (shown in black) placed on the edge of the triangles composing the lattice.

FIG. 2.2: Left: Calculated dipolar energies of the 64 (2048) possible configuration if the one- (two-) ring building block—the energy values refer to 10 nm-thick cobalt islands with a=500 nm, W=200 nm, L=470 nm for the one- (two-) ring building block; Right: Schematic representation of one degenerate state for each of the one-ring building block and the first twelve of the two-ring building block energy levels.

FIG. 2.3 is Energy characterization of the three-ring kagome structure.

FIG. 3.1 is a representation of the step by step fabrication of one sample of polymethyl methacrylate (PMMA) resist on the Silicon substrate.

FIG. 3.2 is a schematic set up of the ELMITEC PEEM at the SIM beamline of the SLS FIG. 4.1 is the schema of the building block investigated in the frame of the present invention.

FIG. 4.2: Left is a graphical representation of hysteresis loop for wider islands either parallel (red) and at 60° (green) to the applied external magnetic filed. Right is a graphical representation of Hysteresis loop for thinner islands for the parallel (red) case and at 60° (green) with the field values having been normalized.

FIG. 4.3 show the main steps of an OOMMF simulation of a two-ring structure with long axis at 90°.

FIG. 4.4 shows the layout of part of a sample, namely the 2R60 controlled building block where the same layout of FIG. 4.1 is used.

FIG. 4.5 is an SEM image of some the artificially made kagome spin ice structure together with their layout as shown in FIG. 4.1: (a) one ring, (b) two ring, (c) three ring controlled building blocks and (d) damaged structure.

FIG. 4.6 are XMCD/PEEM images of the ground states of the artificial kagome spin ice building blocks.

FIG. 4.7 is a histogram of the frequency distribution visualized at different field values for 200 one-ring normal ring and 200 one-ring controlled chirality (anti clockwise and clockwise).

FIG. 4.8 is a graph showing frequency of observed low energy state during magnetization reversal plotted against the number of rings for normal kagome spin ice building blocks structures (red histograms) and controlled ones (blue).

FIG. 4.9 are PEEM images showing, at the top of each box the schematic configuration of the four groups is illustrated while on the bottom for each type, a PEEM image taken during in situ magnetization reversal from white to black is shown.

FIG. 4.10 is the Geometry of the demagnetization setup with the sample rotating about an in-plane axes.

FIG. 4.11 is a graph that shows frequency of low energy states after demagnetization plotted against the number of rings for normal kagome spin ice building block structures (red histograms) and controlled ones (blue).

FIG. 4.12 is a graph that shows frequency of lower energy state after demagnetization process for the two ring with long axis at 60° (orange) and at 90° (green). On the horizontal axis the name of the layout as shown in FIG. 4.1: A and B give an external flux closure state, C and D give the ground state.

FIG. 4.13 is a graphical summary of the steps of one OOMMF simulation with continuous applied field.

FIG. 4.14 is a graphical summary of the steps of one OOMMF simulation with stepwise and continuous applied field.

FIG. 4.15 is a graphical summary of a OOMMF steps simulation for the one-ring normal and chirality controlled building blocks.

FIG. 4.16 is a graphical summary of a OOMMF steps simulation for the two-ring with long axis at 60° normal and chirality controlled building blocks.

FIG. 4.17 is a graphical summary of a OOMMF steps simulation for the two-ring with long axis at 90° normal and chirality controlled building blocks.

FIG. 4.18 is a graphical of a OOMMF steps simulation for the three-ring normal and chirality controlled building blocks.

DESCRIPTION OF THE INVENTION

Methods and Software

Figure 1:
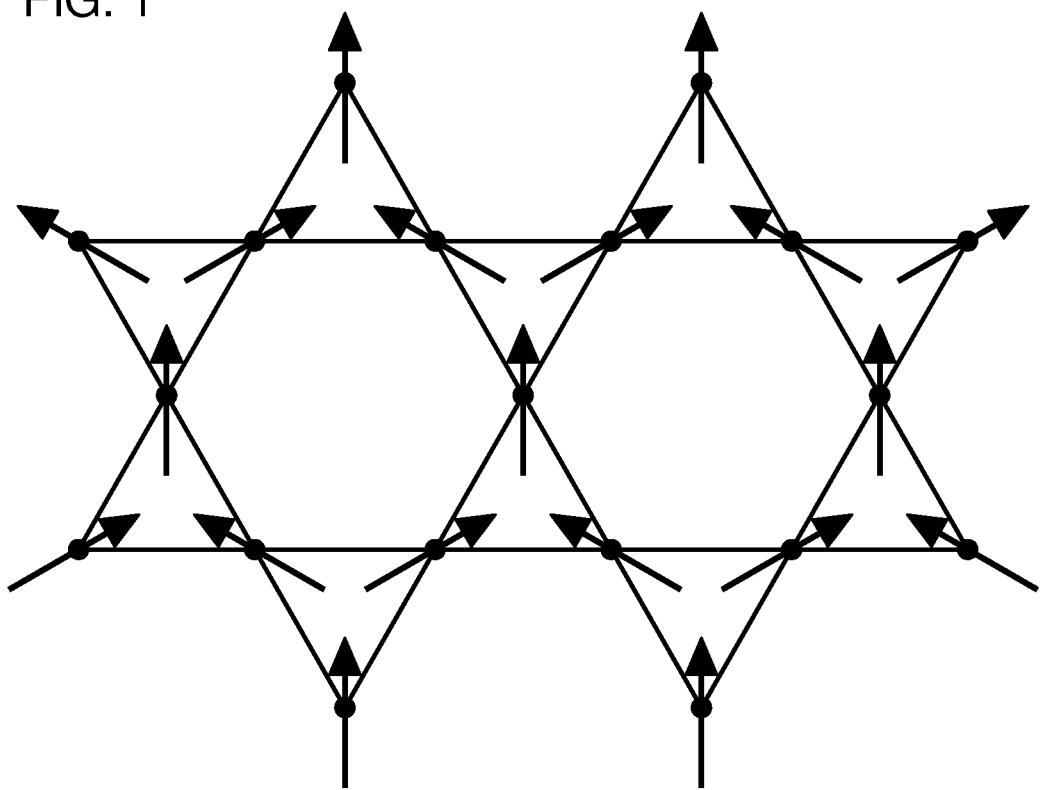
FIG. 1 is a schematic representation of a 2D kagome spin ice structure.
Figure 1:
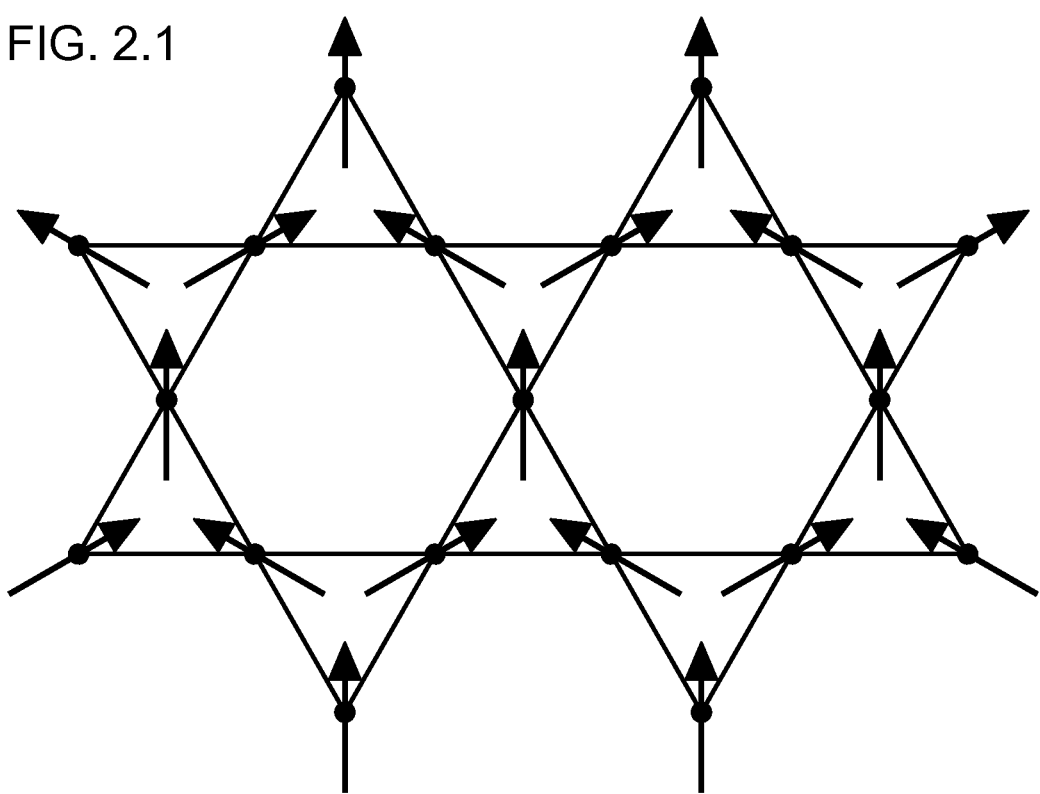

The method used for the sample fabrication is explained together with the magnetic imaging techniques and the simulation framework. Artificial kagome spin ice structures made out of ferromagnetic thin film material are created with electron beam lithography together with lift-off. Additionally, the method used to investigate the magnetization direction of single domain ferromagnetic islands composing the kagome spin ice building block is explained, namely the Photoemission electron microscopy (PEEM) is described together with X-ray magnetic Circular Dichroism (XMCD) effect. With the help of an object oriented micro magnetic framework (OOMMF) the experiment is able simulate the behavior of the building block structures upon magnetization reversal.

Since this experiment is more based on the analysis of PEEM/XMCD data and on the simulation of the magnetization reversal process, the overview of the experimental methods will remain rather short. Any additional information can be found in the previous work of Andr'e Bisig incorporated herein by reference in its entirety (Andre Bisig. Magnetisation reversal processes in coupled ferromagnetic nanoelements. Master's thesis, Paul Scherrer Institut, CH-5232 Villigen PSI, Switzerland, September, 2008.)

3.1 Sample Fabrication

The sample for Photoemission Electron Microscope (PEEM) study is fabricated on a 10×10 mm Si(100) substrate with a thickness of 500 μm. The fabrication makes use of electron beam lithography together with lift-off and the whole process can be divided in four main steps shown in FIG. 3.1 and summarized below.

The first step provides a spin coating 80 nm of polymethyl methacrylate (PMMA) resist on the Silicon substrate. After spin coating, exposure can occur. With an electron beam writer, the desired final geometry can be exposed. In the frame of this work, a Lion Leica Low Voltage 2.5 kV system in the Laboratory for Micro and Nanostructure was used. In the exposed region, the monomer chains of the resist are broken into shorter molecules and that particular region becomes more soluble. With a developer, holes can be therefore created where the resist was exposed to the electron beam. Once the geometry is created in the resist, one has to transfer the pattern into the desired thin film material. Therefore a film layer of permalloy (Ni80Fe20) with the desired thickness is deposited on top of the sample using sputtering technique. The final step includes removing the unwanted film together with the remaining resist. This is performed using the lift-off process in an ultrasound bath of acetone. A quality control of the finished sample with scanning electron microscopy (SEM) is mandatory before the experiment takes place. With this fabrication technique, the island geometry as well as the ferromagnetic material in general, can be controlled, and in particular, for this experiment the different configurations for experiments used in the present invention are formed.

3.2 Magnetic Imaging Method

The direction of the magnetic moment in a ferromagnetic domain can be visualized using the photoemission electron microscopy (PEEM) together with the x-ray magnetic circular dichroism. Due to x-ray magnetic circular dichroism (XMCD) effect in a ferromagnetic, a material difference in spectroscopic absorption depending on the chirality of the incoming x-ray beam exist. The effect is highest at the L-edges (2p-3d transition) of transition metals such as Cobalt, Nickel and Iron since the d-states carry most of the magnetic moment. The XMCD effect has opposite sign in L2 and L3 absorption edge because the opposite sign of the spin-orbit coupling in the 2p states. The emitted electrons are then collected and imaged with a photo emission electron microscope and a CCD camera after a multi channel plate. To get the contrast image, the x-ray energy is set to the L3 absorption edge and a division of the two images taken with different polarization (i.e. circular plus and circular minus) give the final contrast. A black contrast indicates magnetic moments pointing parallel to the x-ray beam while in a white contrast region they points antiparallel. Intermediate grey contrast indicate that they have an intermediate magnetization angle. Since the uniform magnetization islands of the present experiments is along the long axis and since the islands have always a given orientation different than the one perpendicular to the x-ray (either horizontal, ±60° or ±120°) it is possible to gain the whole information about the magnetic configuration in a single image. The magnetic imaging has been carried out at the Surface/Interface Microscopy (SIM) beam line of the Swiss Light Source (SLS) while the PEEM used is an ELMITEC PEEM, sketched in FIG. 3.2.

A limitation of this technique is the fact that it is difficult to image magnetic configurations in the presence of a field due to the deflection of the electrons used for imaging. Therefore magnetization reversal is always studied by taking images at remanence.

FIG. 3.2: Schematic set up of the ELMITEC PEEM at the SIM beamline of the SLS. Circularly polarized x-rays illuminate the sample. The secondary emitted electrons accelerated by an applied voltage of 20 kV are then collected by PEEM electron optics and imaged with a CCD camera.

3.3 OOMMF: Object Oriented Micro Magnetic Framework

The OOMMF program has been developed from the National Istitute of Standards and Tachnology (NIST) in the Information Technology Laboratory. The main contributors to OOMMF are Mike Donahue and Don Porter, who also wrote "OOMMF User's Guide" cited herein. As indicated by the name, OOMMF is a framework software, which means that it is essentially a kind of library for different programs providing the possibility for the user to extend the capability of the micromagnetic analysis by writing additional code to complete the tools offered by OOMMF itself. The software is also provided from a user interface which can be used to make some standard simulations modifying the basic parameters on a micromagnetic experiment. More important information for installation and for running the software can be found in the OOMMF user guide.

3.3.1 OOMMF solver Once the problem has been defined, OOMMF will divide the system point wise in a regular two dimensional square grid where the dimension of the "pixel" should be defined by the user. In order to give a definition of the system close to the reality, OOMMF will than assume a 3D magnetization spin positioned at the center of each cell square. It will integrate numerically the Landau-Lifshitz equation $$\frac{dM}{dt} = -\frac{1}{\gamma} M \times H_{\textit{eff}} - \frac{\gamma\alpha}{M_S} M \times (M \times H_{\textit{eff}}), \quad \text{(equation 3.2)}$$

where
M is the point wise magnetization (A/m)
Heff is the point wise effective field (A/m)
γ is the gyromagnetic ration (m/(As))
α is the damping coefficient.

and the effective field is defined as $$H_{eff} = -\mu^{-1}\frac{\delta E}{\delta M}$$

The average density E is a function of M specified by Brounw's equation, including crystalline anisotropy (calculated assuming constant magnetization for each pixel), exchange energy, demagnetization and applied field terms from Zeeman. All these variables should be given either directly in the micromagnetic input format file (*.MIF) or using the user interface ProblemEd in the OOMMF program.

It is important to mention that the numerical method used to integrate equation (3.1) is a Runge Kutta method with on step error of the order of O (_t3), which means that the procedure will go to the next step only if the system has reached a reasonable stability situation. If the "stability condition" is not satisfied, OOMMF's solver will continue to calculate and renormalize the field value at each point of the defined square grid until the condition is satisfied. At that moment the next field step is applied.

Results

The sample characterization, the results achieved on magnetization reversal and after demagnetization, as well as the OOMMF simulations are discussed herein below.

4.1 Sample Characterization

As cited herein, in the work by Elena Mengotti and colleagues, the islands composing the kagome building block structures have all the same size, namely a width of 170 nm, a length of 470 nm and a uniform thickness of 30 nm. In a highly dipolar coupled case, the distance between island centers corresponds to 500 nm (i.e. the total width of an hexagonal ring was set to 1 µm). In order to induce a certain chirality of the vortex state or a particular low energy state from the many degenerate ones, this new experiment, introduces some asymmetry in the islands composing the buildings block. For instance, in the one-ring building block structure, three of the six islands which are placed above the horizontal axis are be created thinner, and this will have as an effect a change of their switching properties, i.e. they will become harder to switch. In our experiment the thinner islands have now a width of 130 nm while the length is kept approximately constant. A change in width of only 23% leads, in fact, to an enormous increase in the number of particular state during the magnetization reversal as will be shown later herein. Different to the one-ring building block, where only the ground state vortex can be investigated, in the two- and three-rings the geometry of the thinner islands can be placed in a more complex way. The position of the thinner islands is chosen so that during the magnetization reversal, the building blocks fall into one of the two lowest energy states, either the ground state or the external-flux-closure reported in FIGS. 2.2 and 2.3.

In order to control the chirality of the controlled building block, the thinner and the wider islands have to be exchanged, therefore the are in total two types of control for the one-ring structure and four types of control for the two- and three-ring structures. A schematic comparison between the old and new structure is reported in FIG. 4.1.

In order to understand the effect of the difference in sizes among different islands, the single island elements with OOMMF simulations is initially checked without introducing any coupling between them. For a single element i.e. for wider and thinner islands parallel and at ±60° to the applied magnetic field, the hysteresis loop has been computed and the value of coercivity could be estimated.

FIG. 4.1: Schema of the building block investigated in the frame of this work. Left columns the so-called "normal" building blocks structures also previously investigated: here all the islands are identical. Right columns the new controlled structures are shown. The white island are the wider one, with the same size to the previous one (width=170 nm), while the black island are now made thinner (w=130 nm). The wideness is uniform over all the structures (30 nm).

The understanding of the switching properties of the single islands leads to a better evaluation of the magnetization reversal of the whole building block structure. In FIG. 4.2 as well as in Table 4.1 the results of this simulation are presented. The simulation carried out on the single islands clearly shows that the wider islands are effectively softer compared to the thinner ones. Thus, as expected, the wide ones are easier to switch, whereas the thinner island shows a higher resistance upon reversal (a field of twice the strength of the wider islands field). Having a 60° angle to the external field leads to a smaller coercivity value. When considering this effect, one notices that the islands oriented parallel to the field with a wider width have switching filed value comparable with the thin islands at ±60°.

Another difference between the two types of island is given by the absolute value of the magnetization. The island composing the building blocks are in a single domain state, thus can be approximated by an Ising magnetic moment having a magnetization value of (equation 4.1):

$$|\vec{m}| = V \cdot M_s$$

Where $M_s = 860 \cdot 10^3$ A/m is the Saturation Magnetization value for Permalloy (Ni80% Fe20%) and V is the Volume of the island. Assuming the island to fit in regular rectangle box of length $l_{island}$ and width $w_{island}$ with rounded circular ends of radius $(w_{island}/2)$ at the end, the volume will be:

$$V = \left((l_{island} - w_{island})w_{island} + \left(\frac{w_{island}}{2}\right)2_\pi\right) \cdot h_{island} \Rightarrow V_{wide} =$$

$$22.1 \cdot 10^{-22} \text{ m}^3 \Rightarrow V_{Thin} = 16.9 \cdot 10^{-22} \text{ m}^3$$

FIG. 4.2: Left: Hysteresis loop for wider islands either parallel (red) and at 60° (green) to the applied external magnetic filed. Right: Hysteresis loop for thinner islands for the parallel (red) case and at 60° (green). The field values have been normalized.

The extrapolated values for the coercivity field, the saturation field and the calculate magnetization for the different islands types used here are listed in Table 4.1. Due to simple symmetry reasons the 120° island are not listed since their value will be identical to the 60° islands.

|  | $H_{coercivity}$ [a.u.] | $H_{saturation}$ [a.u.] | Magentisation [$\cdot 10^{-16}$ A·m$^2$] |
|---|---|---|---|
| Wide parallel | 0.40 | 0.41 | 2.21 |
| Wide 60° | 0.24 | 0.29 | 2.21 |
| Thin parallel | 0.86 | 0.88 | 1.90 |
| Thin 60° | 0.34 | 0.38 | 1.90 |

Table 4.1: Coercivity and saturation Field of the four type of island used in the experiment. The values of the magnetization are calculate using the formula 4.1

The fact that the 60° oriented islands are, in general, much softer than the one oriented parallel, together with the knowledge that thinner islands are harder can already give rise to an intuitive picture of how the building blocks will behave during the magnetization reversal or even during the demagnetization process. The OOMMF simulations of single islands will not provide a full picture of the exact reversal during the experiments since interaction between islands are not taken into account. In fact, the dipolar interactions will change the values of the coercivity for a given island during a reversal experiment. FIG. 4.3 illustrates the main step of a OOMMF simulation for a two-ring with the long axis at 90°, providing a good example of the effect due to interactions between the islands inside the building blocks. The only consideration of the single island switching behavior does not lead to explain the switching of the two upper diagonal thinner island at the third field step of FIG. 4.3. Only by considering the interactions between the islands composing the building blocks and the influence of the already switched island, the dynamic of the magnetization reversal can be successfully described. In fact the switching field of the two upper island is lowered by the already switched neighboring islands.

FIG. 4.3: Main steps of an OOMMF simulation of a two-ring structure with long axis at 90°.

In order to fully characterize the sample, a description of the existing structures in each sample and the topography of the finished chip has to be investigated with Scanning Electron Microscopy SEM inspection. Each building block type investigated is reproduced many times in four separated arrays containing the same structures types. Fifty structures of the one-ring (1R) building blocks; sixteen structures of the two-ring building block with the long axis oriented at 60° compared to the horizontal direction (2R60); sixteen structures of the two-ring building block with the long axis at 90° (2R90) and sixteen structures for the three-ring (3R) exist on the same sample. In each experiment 100 structures of 1R, 64 of 2R60, 64 of 2R90 and 64 of 3R are simultaneously observed for both the normal structure as well as the controlled (thin island) one. In order to increase the statistic, the whole layout (i.e. 1 R, 2R60, 2R90 and 3R) is repeated in order to double the number of investigated structures.

FIG. 4.4 shows the layout of part of a sample, namely the 2R60 controlled building block where the same layout of FIG. 4.1 is used.

FIG. 4.4: Array of the 2R60 structures building blocks with controlled chirality SEM: Scanning Electron Microcopy Inspection Scanning electron microscopy (SEM) is used to visualize the topological properties of the structure with nanometer resolution. The scanning electron microscope is a very useful tool to control the reliability of the sample used for one experiment. Various defects in the sample such as fabrication defects or contamination in the sample can be easily discovered. In the SEM images, the working distance was kept to 4 mm while the extractor voltage was set to 3 kV. The possibility to look at the structure before as well as after the experiment has been carried out to determine the best sample to look at, as well as for eliminate all the damaged structures. In FIG. 4.5 a damage example is shown.

FIG. 4.5: SEM image of some the artificially made kagome spin ice structure together with their layout as shown in FIG. 4.1: (a) one ring, (b) two ring, (c) three ring controlled building blocks and (d) damaged structure.

XMCD/PEEM Experiment

From a single XMCD/PEEM image, the magnetic configuration of each structure can be detected and therefore the energy state can be determined. Since each of the islands composing the building block structure is in a single domain configuration and since the direction of the magnetization is along the islands axis, with the XMCD it is possible to gain the whole information in a single image. If the magnetic moment is either parallel or antiparallel to the x-ray polarization vector, the ferromagnetic domains will appear totally black or white, whereas for all the other angles these domain will appear on a gray contrast scale. The possible direction are thus the following; with the x-ray direction pointing to the right: black magnetic moment parallel to the x-ray direction, pointing to the right dark gray magnetic moment at ±60° in the x-ray direction light gray magnetic moment at ±120° against the x-ray direction white magnetic moment antiparallel to the x-ray direction, pointing to the left The four contrast levels in a single XMCD image allow the unequivocal determination of the magnetic states. FIG. 4.6 taken from the work achieved by Elena Mengotti and colleagues shows the contrast described above.

FIG. 4.6: XMCD/PEEM images of the ground states of the artificial kagome spin ice building blocks. The x-ray propagation direction is indicated (horizontal). Islands with moments parallel (antiparallel) to the x-ray direction, i.e., pointing to the right (left), have a black (white) contrast. Islands with moments at ±60° and ±120° to the x-ray polarization direction have one of two intermediate contrasts: dark gray or light gray, respectively.

In-Situ Magnetization Reversal

The magnetization reversal has been achieved by starting with a fully saturated configuration where the contrast of all the islands was either white light grey or black dark grey. This was achieved by applying a large magnetic field by passing current through a filament coil placed in the sample holder under the chip sample. In the starting configuration, all the rings are in the so called onion-state (level 3 for the one-ring building block). Then a small field was applied in the opposite direction (always along the horizontal axis) and images were taken at remanence. The field amplitude was increased in steps until the reverse magnetization in the whole sample was reached: i.e. the sample is fully saturated in the opposite direction compared to the starting one. The loop was performed in both directions. It is known that by analyzing the magnetization reversal process of normal building blocks structures, that much less than 100% of the building block structures will pass through the low energy state upon magnetization reversal and also that on increasing the ring number the frequency of low energy states was lowered. With the controlled structures of the present invention, increases to the frequency of low energy states are achieved and also one is able to control exactly which of the low energy states will be achieved upon magnetization reversal. In fact, by looking at the results achieved with the XMCD/PEEM experiment on the controlled one-ring building blocks structures, one can see that 100% success is achieved and the comparison between normal and controlled 1R building block is shown in FIG. 4.7.

The results showed in the histograms 4.7 is quite interesting and clearly show the increase of frequency of low energy states upon reversal for the one-ring controlled chirality state at different field values. Also remarkable is the fact that all the controlled building block reverse their magnetization in a pretty small field range. This behavior has been observed over all the different building blocks investigated.

FIG. 4.7: Histogram of the frequency distribution visualized at different field values for 200 one-ring normal ring and 200 one-ring controlled chirality (anti clockwise and clockwise). The applied magnetic field is here generated by applying a current between 0.6 Ampere and 0.95 Ampere. The corresponding magnetic field is than evaluated by the equation: $\mu_0 H[mT] = 7.66*I[A]+0.03$ which has been extracted from a calibration measurement before the experiment To see the total percentage of structures that goes through the low energy state upon reversal, even if this may happen at different field values, therefore the present invention will take into account the low energy state is seen at a particular field value and check if at the next/previous field steps more structures pass through the low energy state. Only this provides the exact frequency of low energy states percent and the different values for all the structures are reported in the Table 4.2. The error of the frequency has been calculated using the standard deviation.

$$\Delta <X> = \sqrt{\frac{\sum_{i=1}^{N}(<X>-X_i)^2}{N(N-1)}} \quad \text{(Equation 4.2)}$$

where N the number of observed building blocks (N=200 for one-ring, 128 for the others), $X \in [0; 1]$ characterize the success of the experiment and $<X> \in [0, 1]$ is the expected frequency of the low energy state. Remark that when the statistics of our experiment give a frequency of the 100%, the standard deviation as calculated in equation 4.2 would give an error of zero. Be aware that one should take into account the fact that the fabrication process is not perfect and leads to damaged structures. Over all the structures investigated (1168), 1% has been found to have some defect.

FIG. 4.8: Frequency of observed low energy state during magnetization reversal plotted against the number of rings for normal kagome spin ice building blocks structures (red histograms) and controlled ones (blue). Under the plot is also reported the layout of all controlled building blocks investigated.

TABLE 4.2

| Structure type | Expected Energy State | Success in % | Error % |
| --- | --- | --- | --- |
| 1 Ring Normal | Level 1 | 31 | ∓3 |
| 1 Ring Control A | Level 1 (ac) | 100 | ∓0 |
| 1 Ring Control B | Level 1 (c) | 97 | ∓2 |
| 2 Ring 60 Normal | Level 1 or Level 2 | 32 | ∓2 |
| 2 Ring 60 Control C | Level 1 (c - ac) | 100 | ∓0 |
| 2 Ring 60 Control D | Level 1 (ac - c) | 100 | ∓0 |
| 2 Ring 60 Control A | Level 2 (ac) | 100 | ∓0 |
| 2 Ring 60 Control B | Level 2 (c) | 93 | ∓3 |
| 2 Ring 90 Normal | Level 1 or Level 2 | 22 | ∓4 |
| 2 Ring 90 Control C | Level 1 (c - ac) | 100 | ∓0 |
| 2 Ring 90 Control D | Level 1 (ac - c) | 96 | ∓2 |
| 2 Ring 90 Control A | Level 2 (ac) | 96 | ∓3 |
| 2 Ring 90 Control B | Level 2 (c) | 100 | ∓0 |
| 3 Ring Normal | Level 1 or Level 2 | 1 | ∓1 |
| 3 Ring Control C | Level 1 (c - ac - x) | 100 | ∓0 |
| 3 Ring Control D | Level 1 (ac - c - x) | 100 | ∓0 |
| 3 Ring Control A | Level 2 (ac) | 100 | ∓0 |
| 3 Ring Control B | Level 2 (c) | 100 | ∓0 |

Table 4.2: Percentage of all the investigated building blocks that go through a low energy state during magnetization reversal. The errors are calculated using equation 4.2. In the columns for the expected energy, the information in parenthesis (c = clockwise, ac = anti-clockwise and x = 4-2 structure) indicate the ring configuration given when assuming that the start configuration points to the left (i.e white contrast). Please refer to FIG. 4.1 for the structure type.

TABLE 4.3

| Type of building block | Successfully taken to expected energy state | Error in % |
| --- | --- | --- |
| 1 Ring Normal | 31 | ∓3 |
| 1 Ring Control | 98.5 | ∓1 |
| 2 Ring 60 Normal | 32 | ∓4 |
| 2 Ring 60 Control | 98.3 | ∓1 |
| 2 Ring 90 Normal | 22 | ∓4 |
| 2 Ring 90 Control | 98 | ∓1 |
| 3 Ring Normal | 1 | ∓1 |
| 3 Ring control | 100 | ∓0 |

Table 4.3: Percentage of all the investigated building blocks that pass through the low energy state, i.e. ground state or external-flux-closure. The errors are calculated using equation 4.2.

In the table 4.2 the percentage of successfully reached ground states (level 1) or external flux enclosure states (level 2) is given for both controlled and chirality control cases of the different building blocks. A list of the level is also reported in FIGS. 2.2 and 2.3, whereas the structure type is identified in FIG. 4.1. The percentage reported are calculated over all non damaged structures, i.e. more than 99% of the fabricated structures. In order to summarize the high improvement achieved with the chirality controlled structures, it is useful to compare the frequency for the normal building block with the sum over all the four (respectively two for the one-ring structure) types of the controlled building block. This is done in the histogram bar in FIG. 4.8. Some PEEM/XMCD images of the chirality controlled structures taken during reversal are shown in FIG. 4.9.

4.2.2 Demagnetization Process

FIG. 4.10 is the Geometry of the demagnetization setup with the sample rotating about an in-plane axes. The samples are demagnetized by letting the sample rotate with a constant frequency of about 2 Hz, while reducing slowly the external field from well above saturation (780 mT) to 0 with a constant rate of approximately 5 mT/s. A schematic of the process is shown in FIG. 4.10. During the demagnetization, the moments in the ring structures essentially switch back and forth, i.e., between two opposite onion states, as long as the applied field is above the switching field. It is already observed that the switching occurs via states in the lowest energy band, by the in-situ magnetization reversal experiment done in the PEEM. From the very good results achieved high frequency of low energy states also in the demagnetized states is expected. The overall results is a partial increase of frequency of low energy states but the rate is not as high as expected. As explained in the work archived by Elena Mengotti and colleagues, on increasing the number of rings in the structure there is a huge decrease of success in reaching the low energy state (ground state and external flux closure respectively). This is the case also for the controlled building blocks after demagnetization. FIG. 4.11 shows the comparisons between normal and chirality controlled structures.

FIG. 4.9: At the top of each box the schematic configuration of the four groups is illustrated while on the bottom for each type a PEEM image taken during in situ magnetization reversal from white to black is shown. Note that all these images are taken at the same field value.

FIG. 4.11: Frequency of low energy states after demagnetization plotted against the number of rings for normal kagome spin ice building block structures (red histograms) and controlled ones (blue). Under the plot is also reported the layout of all controlled building blocks investigated.

Comparing the controlled state with the normal ones will see an increase of success in achieving the low energy state for the two- and three-ring structures. But there is actually a decrease for the one-ring case. The values are given also in the table 4.4 where the errors are calculated with the standard deviation of equation 4.2.

TABLE 4.4

| Type of building block | Successfully taken to expected energy state | Error in % |
| --- | --- | --- |
| 1 Ring Normal | 75 | ∓3 |
| 1 Ring Control | 65 | ∓3 |
| 2 Ring 60 Normal | 17 | ∓3 |
| 2 Ring 60 Control | 45 | ∓4 |
| 2 Ring 90 Normal | 33 | ∓4 |
| 2 Ring 90 Control | 35 | ∓4 |
| 3 Ring Normal | 1 | ∓1 |
| 3 Ring Control | 23 | ∓4 |

Table 4.4: Percentage of all the investigated building blocks that reach the low energy state during demagnetization process. The errors are calculated using equation 4.2.

As mentioned before, the position of the thinner island (and therefore "harder") and their interaction with other island can have an effect on the final configuration after demagnetization process. Over all the structures investigated, it was observed that similar results for all chirality controlled types, except for the two-ring building block structure which give field orientation and configuration dependent results as illustrated in FIG. 4.12.

The two-ring structure with long axis at 60° has a good response for the external flux enclosure (i.e. 2R60A and 2R60B) with up to 75% success in controlling the chosen state, while this structure does not achieve a high success (33-35%) in getting to the two ground states (i.e. 2R60C and 2R60D). On the other hand the two-ring with long axis at 90° will favorite the two ground states (i.e. 2R90C and 2R90D) with a success percent of 81%, but not succeeding very well in the two external flux enclosure states (i.e. 2R90A and 2R90B) where the frequency of low energy states stops around the 10% as reported in the Table 4.5. Also in this case the errors are calculated using equation 4.2.

FIG. 4.12: Frequency of lower energy state after demagnetization process for the two ring with long axis at 60° (orange) and at 90° (green). On the horizontal axis the name of the layout as shown in FIG. 4.1: A and B give an external flux closure state, C and D give the ground state.

TABLE 4.5

| Type of building block | Successfully taken to expected energy state | Error in % |
| --- | --- | --- |
| 2R60 A | 75 | ∓8 |
| 2R60 B | 59 | ∓9 |
| 2R60 C | 9 | ∓5 |
| 2R60 D | 34 | ∓9 |
| 2R90 A | 16 | ∓7 |
| 2R90 B | 6 | ∓8 |
| 2R90 C | 81 | ∓7 |
| 2R90 D | 38 | ∓9 |

Table 4.5: Percentage of the two-ring controlled kagome spin ice building blocks that reach the low energy state during demagnetization process. The big difference between the 2R90 C and 2R90 D is probably given by the fact that thinner (wider) islands are grouped between wider (thinner) islands, leading to a particular favorable (unfavorable) islands interactions. The errors are calculated using equation 4.2.

4.3 OOMMF Simulations

OOMMF simulations have been used to prove the validity of the experimental results. For all the simulations, a ferromagnetic material permalloy (Ni80% Fe20%) was used without considering other anisotropy which can anyway be neglected in the case of our real experiment. The value used are reported in Table 4.6

TABLE 4.6

| | |
| --- | --- |
| Saturation Magnetization [A/m] | $M_s = 860 \cdot 10^3$ |
| Exchange stiffness [J/m] | $A = 1.3 \cdot 10^{-11}$ |

TABLE 4.6-continued

| | |
| --- | --- |
| Gyromagnetic Ration [m/A s] | $\gamma = 2.21 \cdot 10^5$ (default value used) |
| Damp Coefficient | $A = 0.5$ (default value used) |

Table 4.6: Values used to characterize the material in the OOMMF simulation.

In total three types of simulation have been done as described below, including the pros and cons for all of them together with the results for the different building blocks type.

4.3.1 Continuously Applied Magnetic Field

The first approach to the OOMMF simulation was performed with a continuously applied magnetic field. The applied field, starting from the lowest field, is incremented by defining the steps up to the highest field value. During this field evolution the sample will always stay under the action of the applied field. This is actually in contrast with the real PEEM experiment where the measurement are performed at remanence (zero field). Nevertheless such a simulation, provide a time-saving way to look at the general behavior of the sample, finding roughly the field values where the most important changes happen. FIG. 4.13 illustrate 20 important steps for a magnetization reversal of a two-ring chirality controlled structure. This simulation highlights the problem discussed above: domain walls are present in the islands between the two full polarized configurations. The main problem with this type of simulation is that to reach high precision (i.e. small steps), a lot of time and CPU is required. Even tuning the field step to very small values did not allow us to observe switching process ability. Further work is required here. The desire to find a better simulation for the PEEM in-situ magnetization reversal measurement were the motivation behind new simulation strategy.

4.3.2 Step and Continuous Applied Magnetic Field

In this type of simulation, there are mainly two innovations. The first is to come back to zero field after applied filed values. The second is to concentrate a large number of small steps without returning each time to zero field, in a chosen region which is expected to be of high interest (i.e. where the most changes are expected). In this way it is possible to decrease the long simulation time, to increase the precision of our simulation and also to try to find out the exact field at which the single island do switch.

FIG. 4.13: Summary of the Steps of One OOMMF Simulation With Continuous Applied Field.

In FIG. 4.14 the main step of the mixed applied field simulation for a magnetization reversal experiment are shown. This new simulation still create domain walls without really giving the expected high precision on the area of interest.

4.3.3 Stepwise Applied Magnetic Field

Additionally, it was choosen to eliminate the continuous applied field, saving only the stepwise property of the previous simulation (i.e. returning each time to a zero field). To do so the *.MIF file has to be appropriately modified such that the applied field will oscillate from a step by step increasing or decreasing value always back to zero. Both the number of oscillation and the applied field step can be defined from the user. The simulation varied from twenty for the one-ring building block up to seventy positive field values for the Hysteresis simulation in FIG. 4.2.

An example of the *.MIF file for the simulation of the ground state of the three ring building blocks appears below:

EXAMPLE OF *.MIF FILE an example of * .MIF file for the 00 MMF simulation of the ground state of the three ring building blocks.

The first part describe the properties of the material.
MIF 1.1
material name: Permalloy ms:860000
a: 1.3e-011 k1:0
anisotropy type: uniaxial anisotropy dir1: 1 0 0 anisotropy dir2: 0 1 0 demag type: constmag
The second part is used to define the mask of the system to analyze, the output file name and their properties.
part ~eight: 2.2E-6 part width: 2.1 E-6 part thickness: 30 e-9
part shape: mask app/mmpe/problems/mask/3Rd50g1.bmp cell size:5e-9
ini t mag: uniform 90 180 base output
filename: output /3Rd50g1 /mag log level:O
randomizer seed: 1
user interaction level:1 user report code:30 converge mxh value:.OOOOI randomizer seed: 1
In the last part the function of the applied field is described. For each field range, the start point ($B_xB_yB_z$), the end point ($B_xB_yB_z$) and the number of steps should be given.
34

| Field Fange count: 1 | |
|---|---|
| Field Range: | -1 0 a -1 0 0 1 |
| Field Range: | o 0 0 0 0 0 1 |
| Field Range; | 0.05 0 0 0.05 0 0 1' |
| Field Range: | o 0 0 0 0 0 1 |
| Field Range: | 0.055 0 0 0 0.055 0 0 1 |
| Field Range: | o 000 0 0 1 |
| Field Range: | 0.06 0 0 0 0.06 0 0 1 |
| Field Range: | o 000 001 |
| Field Range: | 0.065 0 0 0 0.065 0 0 1 |
| Field Range: | o 0 0 0 0 0 1 |
| Field Range: | 0.07 0 0 0 0.07 0 0 1 |
| Field Range: | o 000 0 0 1 |
| Field Range: | 0.075 0 0 0 0.075 0 0 1 |
| Field Range: | o 000 0 0 1 |
| Field Range: | 0.08 0 0 0 0.08 0 0 1 |
| Field Range: | o 0 0 0 0 0 1 |

Be aware that modifying these values using the user interface of OOMMF, the number of applied field range will be reduced to a maximum of ten field range.
35

Comparison between normal and controlled building blocks simulation reveal the significant changes in the path for the reversal. The controlled structures will achieve the expected lowest energy state every time, while the normal building block show inability to pass through any low-energy state. It may be that domain walls are trapped at zero field in the simulation due to "symmetry issues". One way to get around this would be to add an angle (1°) to the applied field orientation.

FIG. 4.14: Summary of the steps of one OOMMF simulation with stepwise and continuous applied field An important knowledge gained with this method is that even if one is not able to avoid the creation of domain walls inside the single island, when the zero field is applied, each island tends to reach an equilibrium magnetization which correspond to the absence of domain wall. This simulation will at least be the fastest and the most near to the real experiment. FIGS. 4.15, 4.16, 4.17 and 4.18 illustrate the summary of the simulation for all investigated building blocks made using the stepwise simulation.

FIG. 4.15: Summary of a OOMMF steps simulation for the one-ring normal and chirality controlled building blocks. The fields applied for each column are the same and for the "back to zero" case the simulation is taken at remanence.

FIG. 4.16: Summary of a OOMMF steps simulation for the two-ring with long axis at 60° normal and chirality controlled building blocks. The fields applied for each column are the same and for the "back to zero" case the simulation is taken at remanence.

FIG. 4.17: Summary of a OOMMF steps simulation for the two-ring with long axis at 90° normal and chirality controlled building blocks. The fields applied for each column are the same and for the "back to zero" case the simulation is taken at remanence.

FIG. 4.18: Summary of a OOMMF steps simulation for the three-ring normal and chirality controlled building blocks. The fields applied for each column are the same and for the "back to zero" case the simulation is taken at remanence.

CONCLUSIONS

Building on the work of Elena Mengotti et al., the present invention has proven that building blocks composed of identical elongated ferromagnetic islands placed on the cites of the kagome lattice do not pass through the low energy state with a very high success frequency and their states cannot be controlled. This behavior is improved with the elements investigated here.

By changing the size of some islands placed on the cites of the kagome geometry the present invention will open the possibility to observe a large amount of the degenerate low energy states. In the studies relating to the present inention on in-situ magnetization reversal, it is shown that the probability of controlling the vortex chirality of a building block can be significantly increased. The frequency of one-ring structures that pass through a vortex state with desired chirality is 98.5% and this increases even further for the two-ring an the three-ring up to the maximum 100%. The same frequency value for the uncontrolled structure was significantly lower. The comparison between normal structures with controlled building blocks reveal in addition a reduction of the range in which the building blocks switch. This is an important property for any future application. In contrast, the analysis of the demagnetization process has not been as successful as expected. Over all, there is an increase of success in achieving the low energy state (i.e. ground state or external flux enclosure), but still well below the expectation. The analysis of the demagnetization states shows a pretty inhomogeneous frequency distribution. In fact, some chirality controlled structures have a high frequency of low energy states but some do not. It is believed that this strongly depends on the position of the controlling islands and the final state is highly affected by the whole geometry. The present invention is useful in determining the best configuration of the island on the kagome lattice and how they are interacting with each other. With the help of OOMMF simulation, the studies herein are able to reproduce the experimental result, proving the success in going through the low energy state upon magnetization reversal for the controlled building blocks, while the normal structures do not succeed.

While the invention has been described in its preferred form or embodiment with some degree of particularity, it is understood that this description has been given only by way of example and that numerous changes in the details of construction, fabrication, and use, including the combination and arrangement of parts, may be made without departing from the spirit and scope of the invention.

The invention claimed is:

1. A method for achieving low energy states of functionally coupled islands of a functional material, said functionally coupled island being places within a chirality kagome spin ice structure comprising a honeycomb lattice ring structure, each ring structure having six axis declined by an angle of about 60° one axis to the other, comprising the steps of;
   a) providing a silicon substrate;
   b) coating a photoresist material, such as a polymethyl acrylate resist, on said silicon substrate;
   c) providing an electron beam writer or a photon beam writer;
   d) exposing said coated substrate to an electron beam from said electron beam writer or to a photon beam of said photon beam writer, whereby said exposing forms geometric configuration being a kagome ring component having at least one ring structure; thereby breaking monomer chains of the polymethyl acrylate resist in said exposed region;
   e) removing the broken monomer chains in order to achieve void islands and positioning in a variety of said void islands more than one functionally coupled island, each of the functionally coupled islands being oriented along one of the six axis of the honeycomb lattice ring structure of said kagome spin ice component, wherein the functionally coupled islands are substantially identical in length but differ in width;
   f) said functionally coupled island structures providing a mechanism in which chirality is controlled according to the physical property of the functional material in the functionally coupled islands.

2. The method of claim 1 wherein said physical property of the functional material is selected from a group consisting of:
   a) magnetic dipolar orientation providing a magnetic dipolar coupling;
   b) electric dipolar orientation providing an electrical dipolar coupling;
   c) ferro-electric orientation providing a ferro-electrical coupling;
   d) filled vesicles interlinked by springs with tunable spring constants providing a mechanical coupling;
   e) molecular orientation providing physical binding coupling;
   f) molecular charge or spin orientation providing physical binding coupling as well;
   g) chemical binding status providing coupling by the available coupling links; and
   h) light absorption polarization providing a coupling on plasmonic interactions through the supporting surface or matrix.

3. The method of claim 1 wherein said island structures are separated by a distance of about 500 nm.

4. The method of claim 1 wherein said island structures impart an interaction energy of $10^{-18}$ J. between nearest structures.

5. The method of claim 1 wherein said island structures have a constant length.

6. The method of claim 1 wherein vortex chirality of a kagome spin ice component is increased with size change of said functionally coupled islands.

7. The method of claim 6 wherein the width of the functionally coupled islands within the honeycomb lattice ring structure of said kagome spin ice component is alternating in order to avoid that two adjacent island have the same width.

8. The method of claim 6 wherein a first subgroup of said island structures have a first width and a second subgroup of said island structure have a second width, wherein the first width is greater than the second width.

9. The method of claim 6 wherein the first width ranges from 100 to 500 nm and the second width ranges from 50 to 200 nm; thereby observing that the first width has to be greater that the second width.

* * * * *